(12) United States Patent
Yosui et al.

(10) Patent No.: US 11,424,063 B2
(45) Date of Patent: Aug. 23, 2022

(54) MULTILAYER SUBSTRATE AND METHOD FOR MANUFACTURING SAME

(71) Applicant: Murata Manufacturing Co., Ltd., Nagaokakyo (JP)

(72) Inventors: Kuniaki Yosui, Nagaokakyo (JP); Kazufumi Aisu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1225 days.

(21) Appl. No.: 15/878,440

(22) Filed: Jan. 24, 2018

(65) Prior Publication Data
US 2018/0151287 A1 May 31, 2018

Related U.S. Application Data

(63) Continuation of application No. PCT/JP2016/072604, filed on Aug. 2, 2016.

(30) Foreign Application Priority Data

Aug. 7, 2015 (JP) .............................. JP2015-156540

(51) Int. Cl.
*H01F 5/00* (2006.01)
*H01F 27/28* (2006.01)
(Continued)

(52) U.S. Cl.
CPC ..... *H01F 27/2804* (2013.01); *H01F 17/0013* (2013.01); *H01F 27/245* (2013.01);
(Continued)

(58) Field of Classification Search
USPC ................................. 336/200, 232, 192, 83
See application file for complete search history.

(56) References Cited

U.S. PATENT DOCUMENTS 6,169,470 B1 * 1/2001 Ibata ................... H01F 17/0006
336/200
2008/0157913 A1 * 7/2008 Kim .................... H01F 17/0013
336/200
(Continued)

FOREIGN PATENT DOCUMENTS

JP 09-260144 A 10/1997
JP 2005-032976 A 2/2005
(Continued)

OTHER PUBLICATIONS

Official Communication issued in International Patent Application No. PCT/JP2016/072604, dated Oct. 18, 2016.

*Primary Examiner* — Shawki S Ismail
*Assistant Examiner* — Kazi S Hossain
(74) *Attorney, Agent, or Firm* — Keating & Bennett, LLP

(57) ABSTRACT

A multilayer substrate includes an element assembly including insulating layers stacked along a layer stacking axis including a first direction and a second direction, and a coil disposed at the element assembly. The coil includes a spiral of two or more turns when viewed from the layer stacking axis and extending along the layer the first direction while spiraling from outside inward. A portion of the coil defining an outermost turn of the spiral is defined as a first coil portion, an inner portion of the coil that is the $n^{th}$ nearest from the first coil portion is defined as an $n+1^{th}$ coil portion, and a space between the $n^{th}$ coil portion and the $n+1^{th}$ coil portion is defined as an $n^{th}$ space, where n is a natural number.

9 Claims, 17 Drawing Sheets

(51) Int. Cl.
*H01F 27/29* (2006.01)
*H05K 1/16* (2006.01)
*H01F 17/00* (2006.01)
*H01F 27/245* (2006.01)
*H01F 41/02* (2006.01)
*H01F 41/04* (2006.01)
*H05K 1/02* (2006.01)

(52) U.S. Cl.
CPC ....... H01F 27/292 (2013.01); H01F 41/0233 (2013.01); H01F 41/041 (2013.01); H05K 1/165 (2013.01); *H01F 2017/0073* (2013.01); *H01F 2027/2809* (2013.01); *H05K 1/0237* (2013.01); *H05K 2201/09672* (2013.01)

(56) References Cited

U.S. PATENT DOCUMENTS

| | | | |
|---|---|---|---|
| 2009/0322458 A1* | 12/2009 | Lee | H01F 17/0006 335/299 |
| 2015/0340151 A1 | 11/2015 | Yosui et al. | |
| 2016/0027578 A1* | 1/2016 | Nishino | H01F 41/0233 335/297 |
| 2018/0054900 A1* | 2/2018 | Ueda | H01F 27/327 |

FOREIGN PATENT DOCUMENTS

| | | | |
|---|---|---|---|
| JP | 2005032976 | * | 2/2005 |
| JP | 2013-115242 A | | 6/2013 |
| WO | 2014/129278 A1 | | 8/2014 |

* cited by examiner

MULTILAYER SUBSTRATE AND METHOD FOR MANUFACTURING SAME

CROSS REFERENCE TO RELATED APPLICATIONS

This application claims the benefit of priority to Japanese Patent Application No. 2015-156540 filed on Aug. 7, 2015 and is a Continuation Application of PCT Application No. PCT/JP2016/072604 filed on Aug. 2, 2016. The entire contents of each application are hereby incorporated herein by reference.

BACKGROUND OF THE INVENTION

1. Field of the Invention

The present invention relates to a multilayer substrate including a coil, and a method for manufacturing the multilayer substrate.

2. Description of the Related Art

As a conventional multilayer substrate, for example, a coil-incorporating substrate disclosed in Japanese Patent Application Publication No. 2013-115242 is known. The coil-incorporating substrate includes a body, a first conductive pattern and a second conductive pattern. The body includes a first magnetic layer and a second magnetic layer stacked on each other. The first conductive pattern is disposed on the first magnetic layer and includes a length corresponding to about one turn. The second conductive pattern is disposed on the second magnetic layer and includes a length corresponding to about one turn. However, the diameter of the circle of the second conductive pattern is smaller than the diameter of the circle of the first conductive pattern. Accordingly, the first conductive pattern and the second conductive pattern define a spiral when viewed from the layer stacking axis. An end of the first conductive pattern is electrically connected to an end of the second conductive pattern by a via-hole conductor, and the first conductive pattern and the second conductive pattern define a coil.

In the coil-incorporating substrate disclosed in Japanese Patent Application Publication No. 2013-115242, the coil may be desired to provide a higher self-resonant frequency. In such a case, it is necessary to decrease the capacitance between the first conductive pattern and the second conductive pattern. Also, as the number of turns of the coil increases, the capacitance generated in the coil becomes greater, and therefore, the need to decrease the capacitance becomes greater.

SUMMARY OF THE INVENTION

Preferred embodiments of the present invention provide multilayer substrates with a decreased capacitance of a coil, and methods for manufacturing the multilayer substrates.

A multilayer substrate according to a preferred embodiment of the present invention includes an element assembly including a plurality of insulating layers stacked along a layer stacking axis; and a coil disposed at the element assembly, wherein the coil includes a spiral of two or more turns when viewed from the layer stacking axis and extending along the layer the first direction and spiraling from outside inward; a portion of the coil defining an outermost turn of the spiral is defined as a first coil portion, an inner portion of the coil that is the $n^{th}$ nearest from the first coil portion is defined as an $n+1^{th}$ coil portion, and a space between the $n^{th}$ coil portion and the $n+1^{th}$ coil portion is defined as an $n^{th}$ space, where n is a natural number; a width of the first space is greater than widths of the other spaces when viewed from above; a width of an $m^{th}$ space is greater than a width of an $m+1^{th}$ space, where m is an integer not less than 2 and not more than n; and a line width of the first coil portion is smaller than line widths of the other coil portions.

A multilayer substrate according to a preferred embodiment of the present invention includes an element assembly including a plurality of insulating layers stacked along a layer stacking axis including a first stacking direction and a second stacking direction; and a coil disposed at the element assembly, wherein the coil includes a spiral of two or more turns when viewed from the layer stacking axis and extending in the first direction along the layer stacking axis while spiraling from outside inward; a portion of the coil defining an outermost turn of the spiral is defined as a first coil portion, an inner portion of the coil that is the $n^{th}$ nearest from the first coil portion is defined as an $n+1^{th}$ coil portion, and a space between the $n^{th}$ coil portion and the $n+1^{th}$ coil portion is defined as an $n^{th}$ space, where n is a natural number; a width of the first space is greater than widths of the other spaces when viewed from above; the plurality of insulating layers include a first insulating layer and a second insulating layer; the coil is a conductor layer disposed on the first insulating layer; and the second insulating layer is located farther in the second direction than the first insulating layer, the second insulating layer at least partially overlapping a relatively inner portion of the coil and not overlapping a relatively outer portion of the coil.

A multilayer substrate according to a preferred embodiment of the present invention includes an element assembly including a plurality of insulating layers stacked along a layer stacking axis including a first direction and a second direction; and a coil disposed at the element assembly, wherein the coil includes a spiral of two or more turns when viewed from the layer stacking axis and extending in the first direction and spiraling from outside inward; a portion of the coil defining an outermost turn of the spiral is defined as a first coil portion, an inner portion of the coil that is the $n^{th}$ nearest from the first coil portion is defined as an $n+1^{th}$ coil portion, and a space between the $n^{th}$ coil portion and the $n+1^{th}$ coil portion is defined as an $n^{th}$ space, where n is a natural number; a width of the first space is greater than widths of the other spaces when viewed from above; the plurality of insulating layers include a first insulating layer and a third insulating layer; the coil is a conductor layer disposed on the first insulating layer; and the third insulating layer is located farther in the first direction than the first insulating layer, the third insulating layer not overlapping a relatively inner portion of the coil and at least partially overlapping a relatively outer portion of the coil.

A multilayer substrate manufacturing method according to a preferred embodiment of the present invention is a method for manufacturing a multilayer substrate including an element assembly including a first insulating layer and a second insulating layer stacked in this order from a first direction toward a second direction along a layer stacking axis; and a coil disposed at the element assembly, wherein the coil includes a spiral of two or more turns when viewed from the layer stacking axis and extending along the layer stacking axis toward the first direction and spiraling from outside inward; a portion of the coil defining an outermost turn of the spiral is defined as a first coil portion, an inner portion of the coil that is the $n^{th}$ nearest from the first coil portion is defined as an n+1$^{th}$ coil portion, and a space between the n$^{th}$ coil portion and the n+1$^{th}$ coil portion is defined as an n$^{th}$ space, where n is a natural number; and a width of the first space is greater than widths of the other spaces when viewed from above, the method including a coil forming step of forming the coil on the first insulating layer; and a first stacking step of placing the second insulating layer over the first insulating layer with the second insulating layer located farther in the second direction than the first insulating layer and with the second insulating layer at least partially overlapping a relatively inner portion of the coil and not overlapping a relatively outer portion of the coil.

A multilayer substrate manufacturing method according to a preferred embodiment of the present invention is a method for manufacturing a multilayer substrate including an element assembly including a first insulating layer and a third insulating layer stacked in this order from a second direction toward a first direction along a layer stacking axis; and a coil disposed at the element assembly, wherein the coil includes a spiral of two or more turns when viewed from the layer stacking axis and extending along the layer stacking axis toward the first direction while spiraling from outside inward; a portion of the coil defining an outermost turn of the spiral is defined as a first coil portion, an inner portion of the coil that is the n$^{th}$ nearest from the first coil portion is defined as an n+1$^{th}$ coil portion, and a space between the n$^{th}$ coil portion and the n+1$^{th}$ coil portion is defined as an n$^{th}$ space, where n is a natural number; and a width of the first space is greater than widths of the other spaces when viewed from above, the method including a coil forming step of forming the coil on the first insulating layer; and a stacking step of placing the third insulating layer over the first insulating layer with the third insulating layer located farther in the first direction than the first insulating layer and with the third insulating layer not overlapping a relatively inner portion of the coil and at least partially overlapping a relatively outer portion of the coil.

Preferred embodiments of the present invention provide a decrease in capacitance of coils in multilayer substrates.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
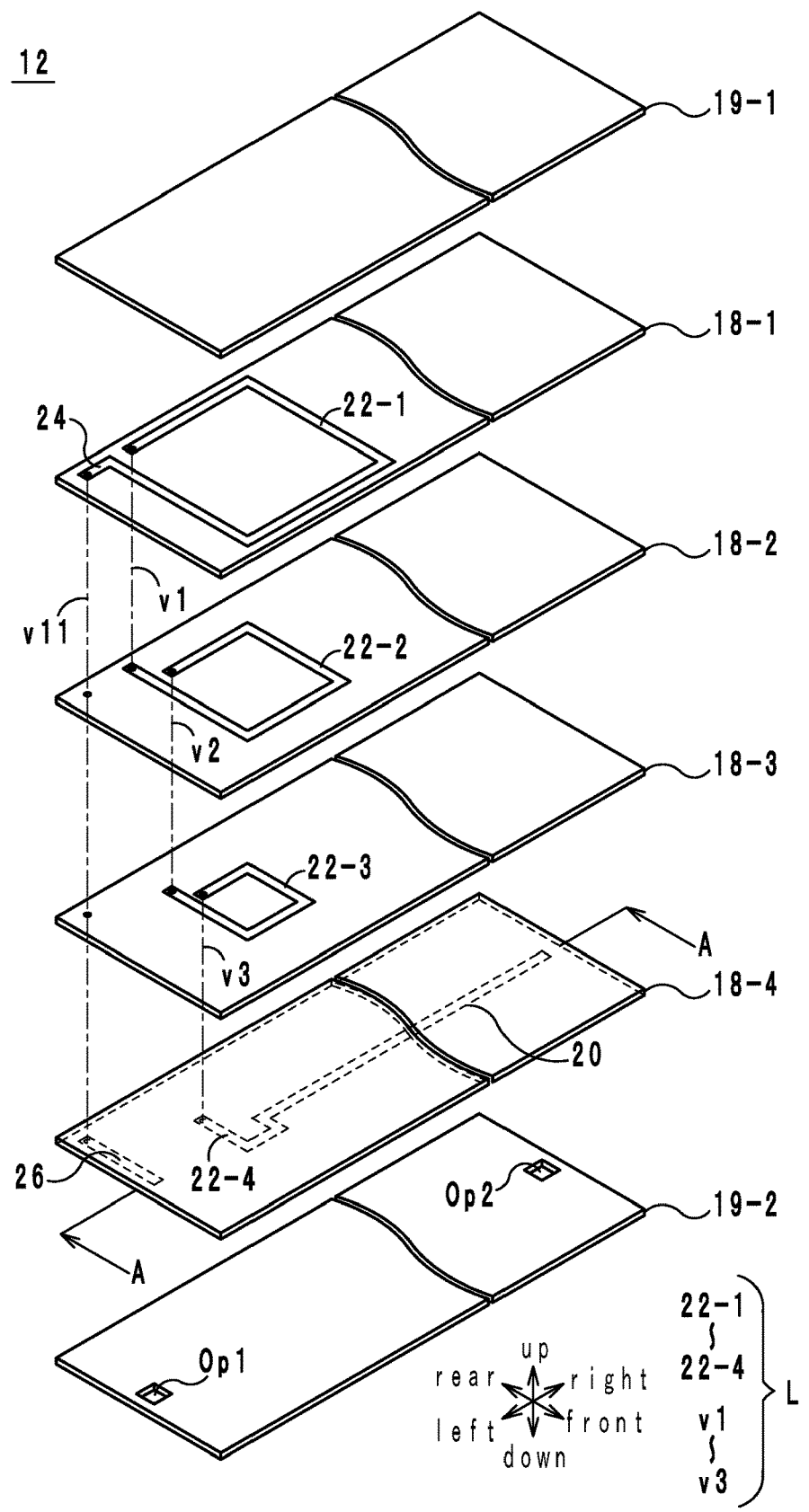
FIG. 1 is an exploded perspective view of a multilayer substrate 10*a* according to a preferred embodiment of the present invention.

Preferred embodiments of the present invention will hereinafter be described with reference to the drawings.

It is to be noted that the following preferred embodiments represent examples of the present invention for merely illustrative purposes, and that the present invention is not limited to matters disclosed in the following preferred embodiments. The matters disclosed in the different preferred embodiments are able to be combined with each other in practical applications, and modified preferred embodiments in those cases are also included in the scope and spirit of the present invention. The drawings serve to assist understanding of the preferred embodiments, and they are not always exactly drawn in a strict sense. In some cases, for instance, dimension ratios between constituent elements themselves or dimension ratios of distances between elements or features, which are shown in the drawings, are not in match with the dimension ratios described in the Description. Furthermore, some of the elements or features, which are explained in the Description, are omitted from the drawings, or they are shown in a reduced number on a case-by-case basis.

Figure 2:
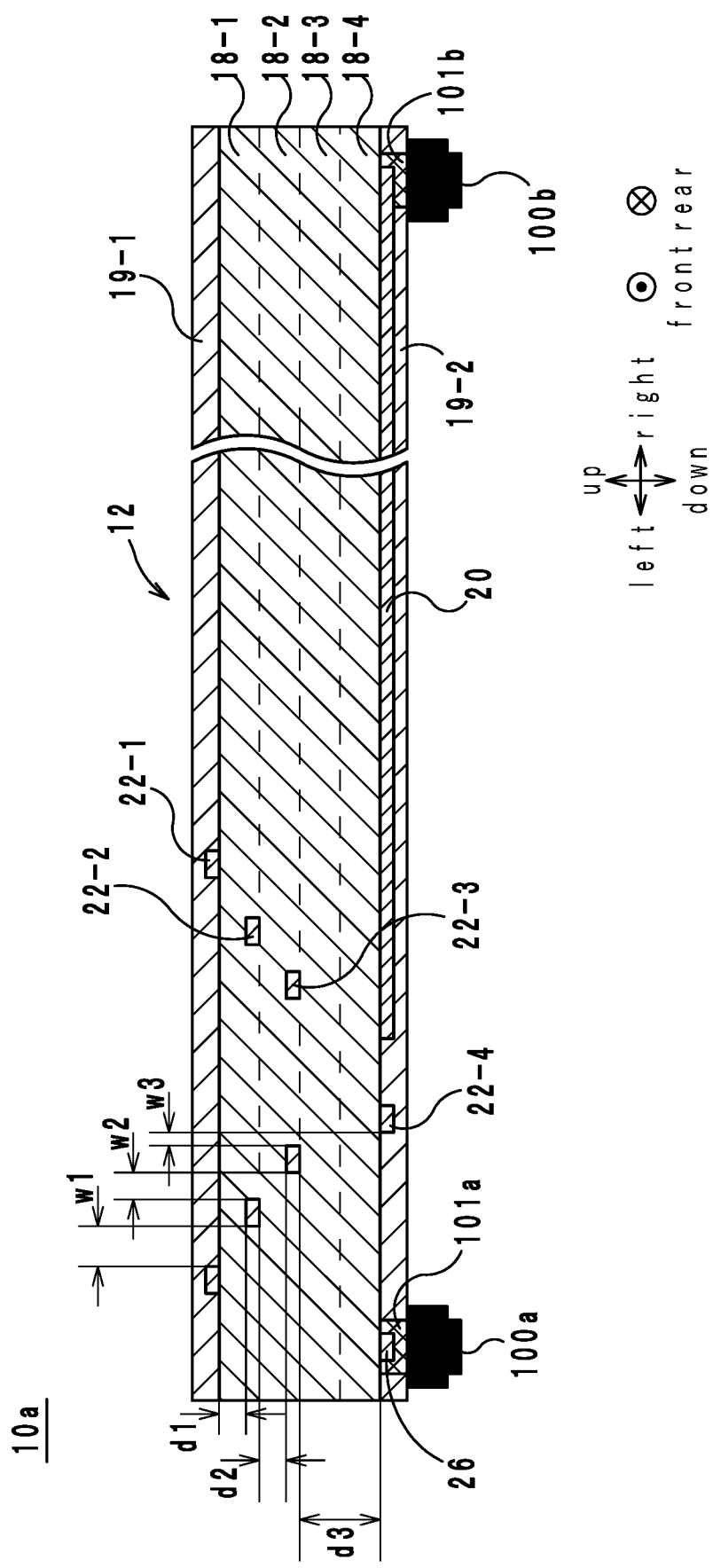
FIG. 2 is a sectional view of the multilayer substrate 10*a* along the line A-A in FIG. 1.
Figure 3:
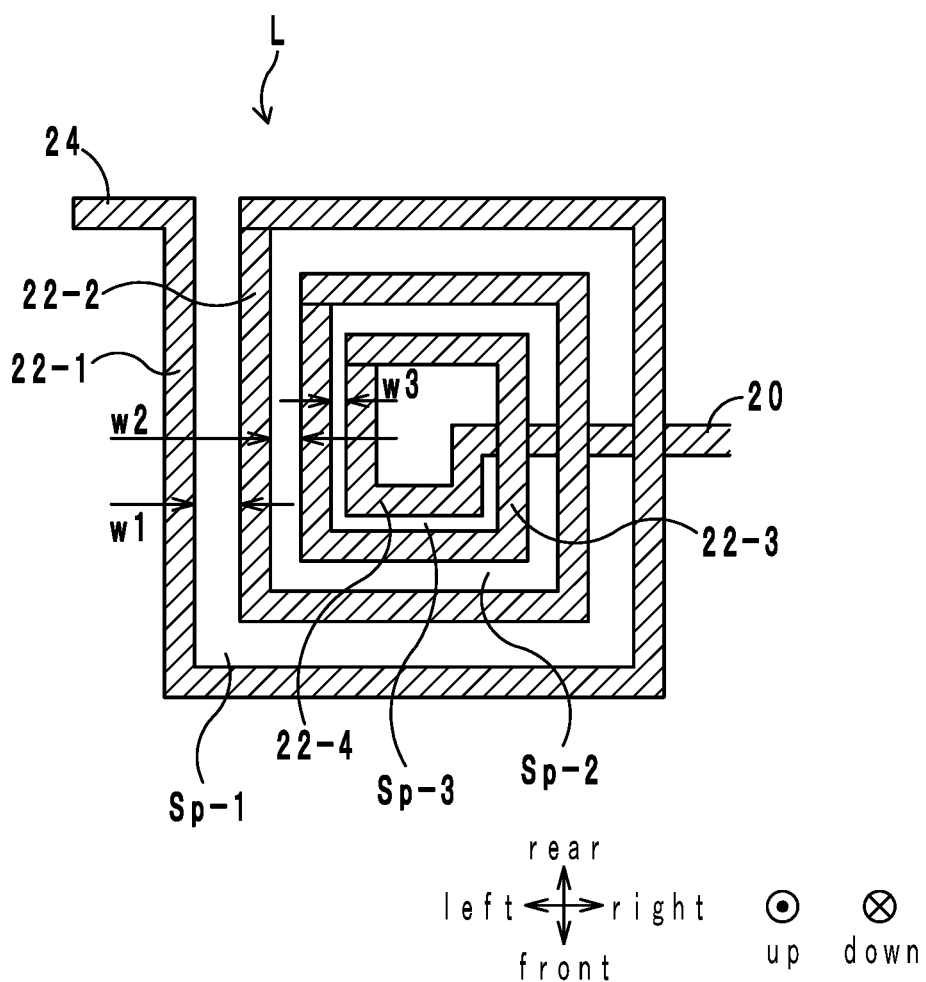
FIG. 3 is a top view of a coil L in the multilayer substrate 10*a*.

FIG. 1 is an exploded perspective view of the multilayer substrate 10*a* according to a preferred embodiment of the present invention. FIG. 2 is a sectional view of the multilayer substrate 10*a* along the line A-A in FIG. 1. It is to be noted that connectors 100*a* and 100*b* are omitted in FIG. 1 for clarity and are shown in FIG. 2. FIG. 3 is a top view of a coil L in the multilayer substrate 10*a*. In the following description, the axis in which layers of the multilayer substrate 10*a* are stacked on one another is referred to as an up-down axis, the longitudinal axis of the multilayer substrate 10*a* is referred to as a right-left axis, and the lateral axis of the multilayer substrate 10*a* is referred to as a front-rear axis. The up-down axis, the right-left axis, and the front-rear axis are perpendicular or substantially perpendicular to each other.

The multilayer substrate 10*a* is, for example, a flexible substrate included in an electronic device, such as a cell phone or the like, to electrically connect two high-frequency circuits to each other. As shown in FIGS. 1 and 2, the multilayer substrate 10a includes a dielectric element assembly 12, a signal line 20, connection conductors 24 and 26, connectors 100a and 100b, a via-hole conductor v11, and a coil L.

As shown in FIG. 1, the dielectric element assembly 12 is a flexible plate member extending in the right-left axis when viewed from above. The dimension in the front-rear axis (width) of the dielectric element assembly 12 is constant or substantially constant. As shown in FIG. 1, the dielectric element assembly 12 is a multilayered body including a protective layer 19-1, dielectric sheets 18-1 to 18-4, and a protective layer 19-2 that are stacked in this order from top to bottom. An upper principal surface of the dielectric element assembly 12 is referred to as a top surface, and a lower principal surface of the dielectric element assembly 12 is referred to as a bottom surface.

As shown in FIG. 1, each of the dielectric sheets 18-1 to 18-4 extends in the right-left axis and includes the same or a similar shape as the element assembly 12 when viewed from above. The dielectric sheets 18-1 to 18-4 are insulating layers including flexible thermoplastic resin, for example, polyimide, liquid crystal polymer or the like. An upper principal surface of each of the dielectric sheets 18-1 to 18-4 is referred to as an upper surface, and a lower principal surface of each of the dielectric sheets 18-1 to 18-4 is referred to as a lower surface.

The protective layer 19-1 is an insulating layer covering an entire or substantially an entire upper surface of the dielectric sheet 18-1. The protective layer 19-2 is an insulating layer covering an entire or substantially an entire lower surface of the dielectric sheet 18-4. The protective layer 19-2 includes an opening Op1 in a left end portion and an opening Op2 in a right end portion, which correspond to regions not covered by the protective layer 19-2. The protective layers 19-1 and 19-2 include, for example, flexible resin, for example, a resist material or the like.

The coil L is disposed in the dielectric element assembly 12. The coil L includes a spiral of more than two turns, preferably three and five eighth turns in the present preferred embodiment, for example, and the coil L extends from the top downward while spiraling from the outside inward. Such a spiral structure is referred to as a conical spiral structure.

The coil L includes coil portions 22-1 to 22-4 and via-hole conductors v1 to v3. The coil portion 22-1 (a first coil portion) is a conductor layer disposed in a left end portion of the upper surface of the dielectric sheet 18-1, and the coil portion 22-1 is a portion defining the outermost one turn of the coil L. The coil portion 22-2 (a second coil portion) is a conductor layer disposed in a left end portion of the upper surface of the dielectric sheet 18-2, and the coil portion 22-2 is an inner portion that is the nearest from the coil portion 22-1. The coil portion 22-3 (a third coil portion) is a conductor layer disposed in a left end portion of the upper surface of the dielectric sheet 18-3, and the coil portion 22-3 is an inner portion that is the second nearest from the coil portion 22-1. The coil portion 22-4 (a fourth coil portion) is a conductor layer disposed in a left end portion of the upper surface of the dielectric sheet 18-4, and the coil portion 22-4 is an inner portion that is the third nearest from the coil portion 22-1. As described above, the coil L includes four coil portions 22-1 to 22-4. However, the coil L may include n+1 coil portions 22-1 to 22-$n$+1, wherein n is a natural number, for example. In this case, the coil portion 22-$n$+1 (an n+1$^{th}$ coil portion) is an inner portion that is the n$^{th}$ nearest from the coil portion 22-1.

Each of the coil portions 22-1 to 22-3 includes a length corresponding to about one turn and includes a rectangular or substantially rectangular shape with a cutout. In the present preferred embodiment, each of the coil portions 22-1 to 22-3 includes a cutout at the left end of the rear side. The coil portion 22-4 includes a length corresponding to about five eighth turns. An upstream end in the counterclockwise direction of each of the coil portions 22-1 to 22-4 is referred to as an upstream end, and a downstream end in the counterclockwise direction of each of the coil portions 22-1 to 22-4 is referred to as a downstream end.

A length of a portion of the coil portion 22-1 extending in the front-rear axis is longer than a length of a portion of the coil portion 22-2 extending in the front-rear axis, and a length of a portion of the coil portion 22-1 extending in the right-left axis is longer than a length of a portion of the coil portion 22-2 extending in the right-left axis. The length of a portion of the coil portion 22-2 extending in the front-rear axis is longer than a length of a portion of the coil portion 22-3 extending in the front-rear axis, and the length of a portion of the coil portion 22-2 extending in the right-left axis is longer than a length of a portion of the coil portion 22-3 extending in the right-left axis. The length of a portion of the coil portion 22-3 extending in the front-rear axis is longer than a length of a portion of the coil portion 22-4 extending in the front-rear axis, and the length of a portion of the coil portion 22-3 extending in the right-left axis is longer than a length of a portion of the coil portion 22-4 extending in the right-left axis. The coil portions 22-1 to 22-4 are equal or substantially equal in line width, and each of the coil portions 22-1 to 22-4 includes a constant or substantially constant line width over their respective lengths. Accordingly, an entire length of the coil portion 22-1 is the longest, and the coil portions 22-2 and 22-3 are in the order of decreasing in entire length. An entire length of the coil portion 22-4 is the shortest.

As shown in FIGS. 1 and 3, when the coil L is viewed from above, the downstream end of the coil portion 22-1 and the upstream end of the coil portion 22-2 at least partially overlap each other. When the coil L is viewed from above, the downstream end of the coil portion 22-2 and the upstream end of the coil portion 22-3 at least partially overlap each other. When the coil L is viewed from above, the downstream end of the coil portion 22-3 and the upstream end of the coil portion 22-4 at least partially overlap each other.

The via-hole conductor v1 pierces through the dielectric sheet 18-1 in the up-down axis to electrically connect the downstream end of the coil portion 22-1 and the upstream end of the coil portion 22-2. The via-hole conductor v2 pierces through the dielectric sheet 18-2 in the up-down axis to electrically connect the downstream end of the coil portion 22-2 and the upstream end of the coil portion 22-3. The via-hole conductor v3 pierces through the dielectric sheet 18-3 in the up-down axis to electrically connect the downstream end of the coil portion 22-3 and the upstream end of the coil portion 22-4.

As shown in FIG. 2, the distance d1 in the up-down axis between the coil portion 22-1 and the coil portion 22-2 is equal or substantially equal to the distance d2 in the up-down axis between the coil portion 22-2 and the coil portion 22-3. The distance d3 in the up-down axis between the coil portion 22-3 and the coil portion 22-4 is greater than the distances d1 and d2.

The coil L provides a decrease in capacitance as described below. The space between the coil portion 22-1 and the coil portion 22-2 is referred as a space Sp-1. The space between the coil portion 22-2 and the coil portion 22-3 is referred as a space Sp-2. The space between the coil portion 22-3 and the coil portion 22-4 is referred as a space Sp-3. In the present preferred embodiment, the coil L includes four coil portions 22-1 to 22-4, but the coil L may include, for example, n+1 coil portions 22-1 to 22-n+1, where n is a natural number. In this case, the space between the coil portion 22-n (an $n^{th}$ coil portion) and the coil portion 22-n+1 (an n+$1^{th}$ coil portion) is referred to as a space Sp-n (an $n^{th}$ space).

As shown in FIG. 3, when the coil L is viewed from above, a width w1 of the space Sp-1 is greater than any of widths w2 and w3 of the other spaces Sp-2 and Sp-3. When the coil L is viewed from above, the width w2 of the space Sp-2 is greater than the width w3 of the space Sp-3. In general terms, when the coil L is viewed from above, the width wm of a space Sp-m (an $m^{th}$ space) is greater than the width wm+1 of a space Sp-m+1 (an m+$1^{th}$ space), where m is an integer not less than 2 and not more than n. Thus, the width of the space between two adjacent coil portions in an outer portion of the coil L is greater than the width of the space between two adjacent coil portions in an inner portion of the coil L. Each of the spaces Sp-1 to Sp-4 includes a constant or substantially constant width over their respective lengths.

The connection conductor 24 is a conductor layer that is disposed on the upper surface of the dielectric sheet 18-1 and extends leftward from the upstream end of the coil portion 22-1. The connection conductor 26 is a conductor layer that is disposed on the lower surface of the dielectric sheet 18-4 and extends along the left side of the dielectric sheet 18-4. The left end of the connection conductor 24 and the rear end of the connection conductor 26 at least partially overlap each other when viewed from above. Also, a front end of the connection conductor 26 at least partially overlaps the opening Op1 when viewed from above. Accordingly, the front end of the connection conductor 26 is exposed to the outside of the dielectric element assembly 12 and functions as and defines an external electrode. The exposed portion of the connection conductor 26 is preferably plated with a Ni/Au alloy.

The via-hole conductor v11 pierces through the dielectric sheets 18-1 to 18-4 in the up-down axis to electrically connect the left end of the connection conductor 24 and the rear end of the connection conductor 26.

The signal line 20 is a conductor layer that is disposed on the lower surface of the dielectric sheet 18-4 and extends rightward from the downstream end of the coil portion 22-4. The right end of the signal line 20 at least partially overlaps the opening Op2 when viewed from above. Accordingly, the right end of the signal line 20 is exposed to the outside of the dielectric element assembly 12 and defines and functions as an external electrode. The exposed portion of the signal line 20 is preferably plated with a Ni/Au alloy.

The signal line 20, the coil portions 22-1 to 22-4, and the connection conductors 24 and 26 include a low-specific resistance metal material primarily including silver or copper. The signal line 20 being disposed on the lower surface of the dielectric sheet 18-4 indicates that the signal line 20-1 is formed by plating the lower surface of the dielectric sheet 18-4 with metal foil and patterning the metal foil or that the signal line 20-1 is formed by applying a sheet of metal foil on the lower surface of the dielectric sheet 18-4 and patterning the metal foil. Further, the surface of the signal line 20 is smoothed, and therefore, the surface of the signal line 20 in contact with the dielectric sheet 18-4 includes a greater surface roughness than the surface thereof out of contact with the dielectric sheet 18-4. The same applies to the coil portions 22-1 to 22-4, and the connection conductors 24 and 26.

The via-hole conductors v1 to v3 and v11 are formed by filling via-holes located in the dielectric sheets 18-1 to 18-4 with a conductive paste primarily including silver, tin, copper or the like and solidifying the conductive paste. The via-hole conductors v1 to v3 and v11 may be formed by plating via-holes located in the dielectric sheets 18-1 to 18-4 with metal.

The connectors 100a and 100b are mounted by solder 101a and 101b applied in the openings Op1 and Op2. More specifically, each of the connectors 100a and 100b includes an external electrode (not shown) on the upper surface. The external electrode of the connector 100a is electrically connected to the front end of the connection conductor 26 via the solder 101a, and the external electrode of the connector 100b is electrically connected to the right end of the signal line 20 via the solder 101b.

Figure 4:
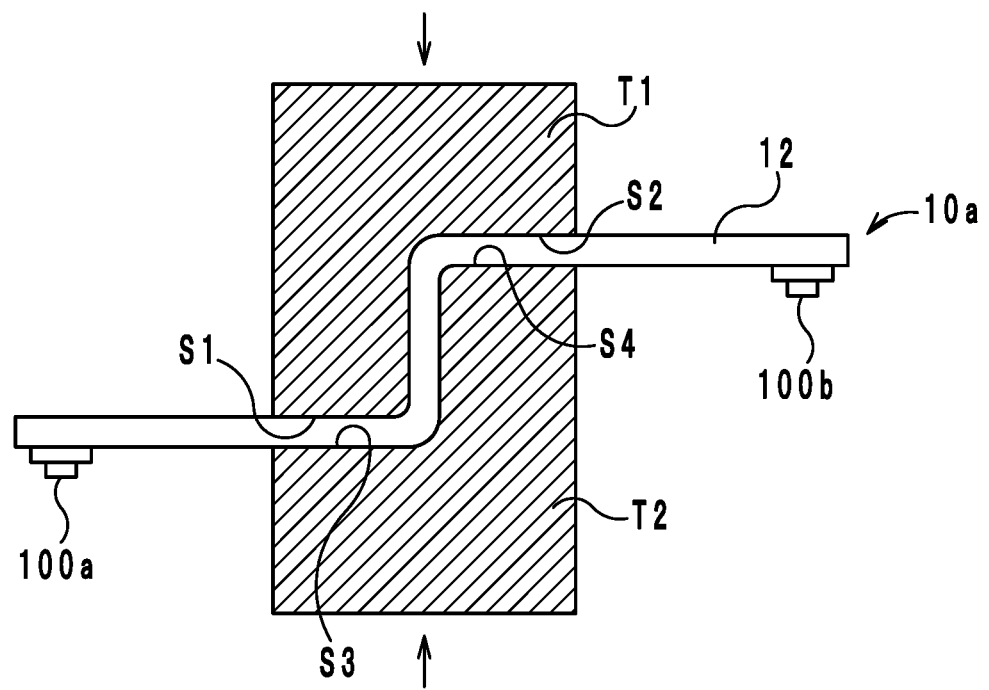
FIG. 4 is a diagram illustrating processing of the multilayer substrate 10*a*.
Figure 5:
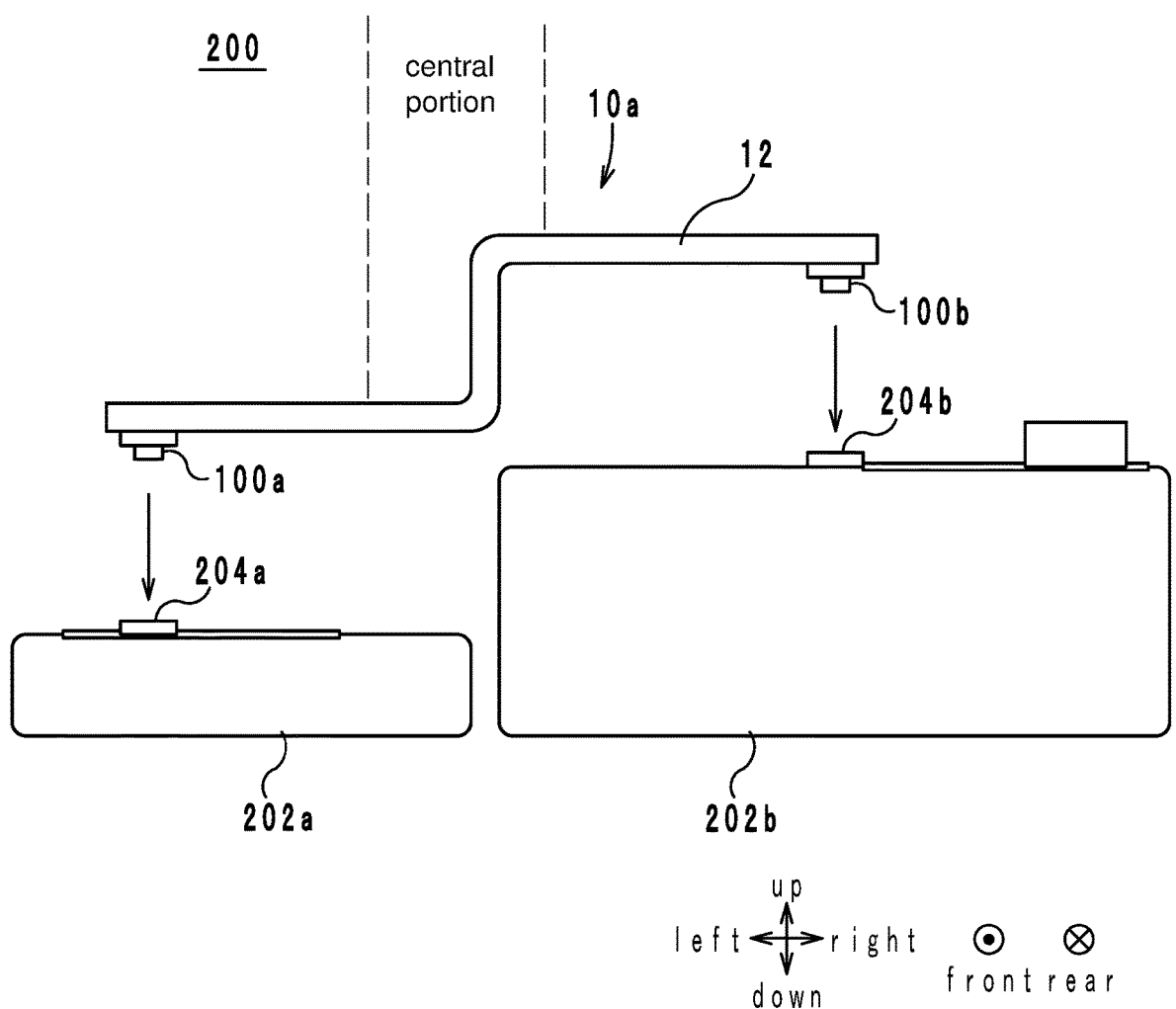
FIG. 5 is a front view of an electronic device 200 that includes the multilayer substrate 10*a*.

The multilayer substrate 10a may be included in an electronic device 200 as described below. FIG. 4 is a diagram illustrating processing of the multilayer substrate 10a. FIG. 5 is a front view of the electronic device 200 that includes the multilayer substrate 10a.

A central portion of the multilayer substrate 10a in the right-left axis, that is, a portion in which the coil L is not disposed, is bent. The multilayer substrate 10a is bent at two locations by pressure applied from above and below by tools T1 and T2. The tool T1 includes a surface S1 located at a relatively lower level and a surface S2 located at a relatively higher level. The surfaces S1 and S2 face down. The tool T2 includes a surface S3 located at a relatively lower level and a surface S4 located at a relatively higher level. The surfaces S3 and S4 face up. The distance in the up-down axis between the surface S1 and the surface S2 is equal or substantially equal to the distance in the up-down axis between the surface S3 and the surface S4.

Each of the tools T1 and T2 includes a built-in heater. The multilayer substrate 10a is nipped from above and below between the surfaces S1 and S3 and between the surfaces S2 and S4. Accordingly, the multilayer substrate 10a is bent at a location slightly shifted leftward off from the center in the right-left axis with the top surface thereof valley-folded at about 90 degrees, and is bent at a location slightly shifted rightward off from the center in the right-left axis with the top surface thereof mountain-folded at about 90 degrees. Thereafter, the tools T1 and T2 are retracted from the multilayer substrate 10a, and the multilayer substrate 10a is cooled. Thus, the multilayer substrate 10a is processed to include a plastically deformed portion. The multilayer substrate 10a maintains flexibility even after undergoing a bending process, and the multilayer substrate 10a is able to be easily attached to circuit boards 202a and 202b.

As shown in FIG. 5, the electronic device 200 includes receptacles 204a and 204b, in addition to the multilayer substrate 10a, and the circuit boards 202a and 202b.

The circuit board 202a includes, for example, a transmitting circuit or a receiving circuit including an antenna. The circuit board 202a and the circuit board 202b are arranged in this order from left to right. The upper principal surface of the circuit board 202b is at a higher level than the upper principal surface of the circuit board 202a.

The receptacles 204a and 204b are disposed on the upper principal surfaces of the circuit boards 202a and 202b, respectively. Accordingly, the receptacle 204b is located at a higher level than the receptacle 204a. In this situation, the multilayer substrate 10a is bent as shown in FIG. 4. Then, the connectors 100a and 100b are electrically connected to the receptacles 204a and 204b, respectively. Accordingly, the multilayer substrate 10a electrically connects the circuit boards 202a and 202b to each other.

Figure 6:
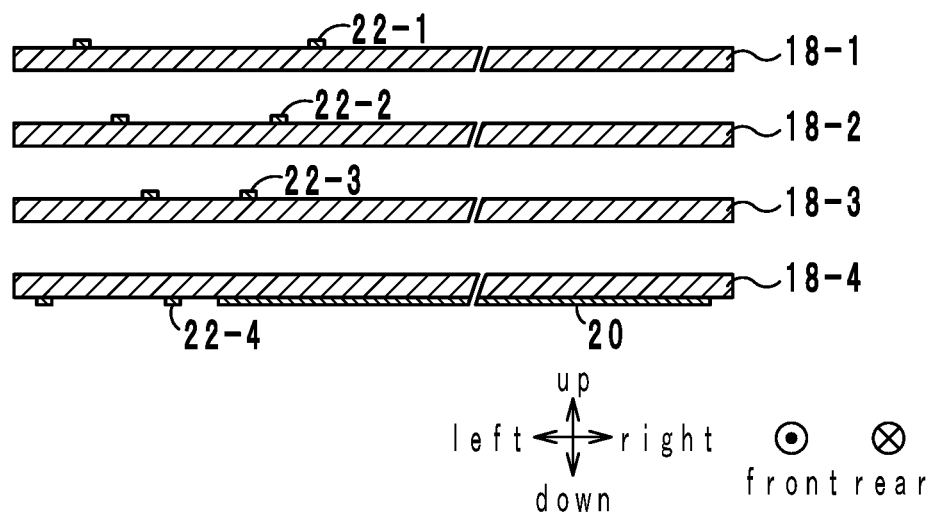
FIG. 6 is a sectional view of the multilayer substrate 10*a* during the manufacture thereof.
Figure 7:
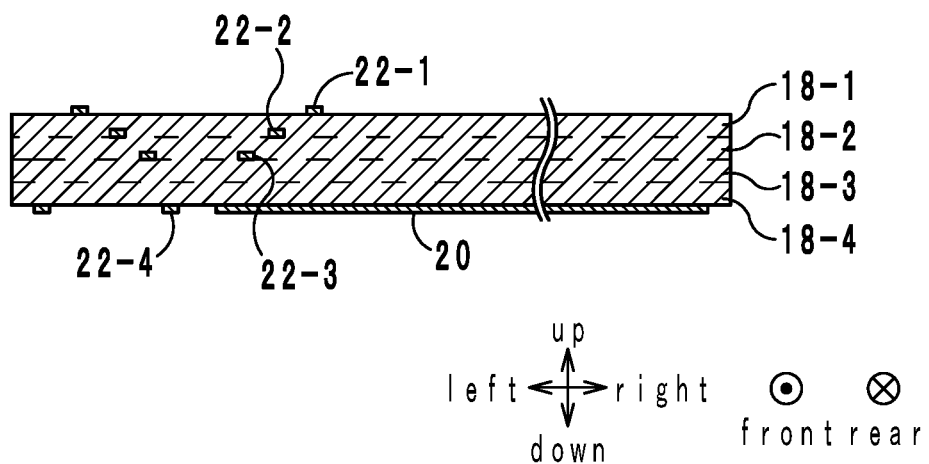
FIG. 7 is a sectional view of the multilayer substrate 10*a* during the manufacture thereof.
Figure 8:
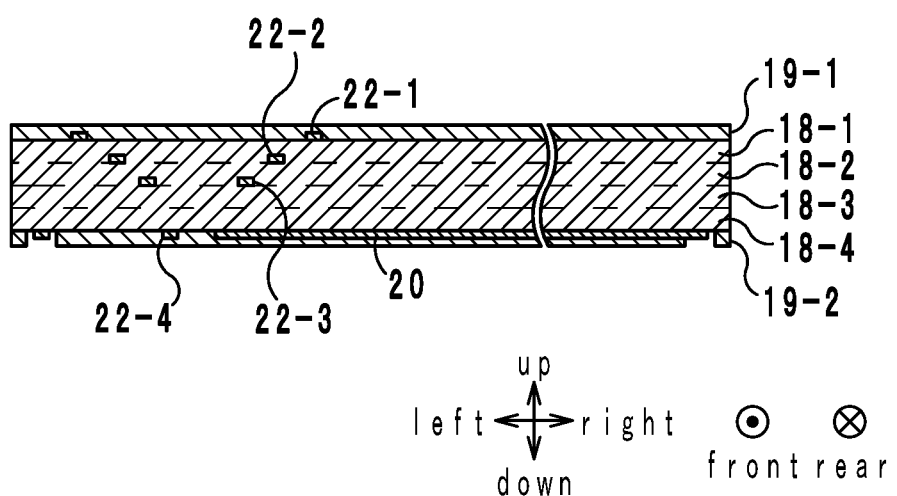
FIG. 8 is a sectional view of the multilayer substrate 10*a* during the manufacture thereof.

A method for manufacturing the multilayer substrate 10a is described below with reference to the drawings. FIGS. 6 to 8 are sectional views of the multilayer substrate 10a during the manufacturing process. A case of manufacturing one multilayer substrate 10a is described below as an example. However, preferably, large-sized dielectric sheets are stacked and cut, and thus a plurality of multilayer substrates 10a are able to be manufactured at a time.

First, dielectric sheets 18-1 to 18-4 including thermoplastic resin, each of which includes a sheet of copper foil located entirely or substantially entirely on one principle surface, are prepared. Specifically, a sheet of copper foil is applied onto the upper surface of each of the dielectric sheets 18-1 to 18-3. A sheet of copper foil is applied onto the lower surface of the dielectric sheet 18-4. Further, the sheets of copper foil on the dielectric sheets 18-1 to 18-4 are galvanized and smoothed. The dielectric sheets 18-1 to 18-4 are liquid crystal polymer, for example.

Next, the copper foil provided on the upper surface of the dielectric sheet 18-1 is patterned, and thus the coil portion 22-1 and the connection conductor 24 shown in FIG. 1 are formed on the upper surface of the dielectric sheet 18-1. Specifically, resists that are the same or similar shapes as the coil portion 22-1 and the connection conductor 24, respectively, are printed on the copper foil on the upper surface of the dielectric sheet 18-1. Next, the copper foil is etched, and the copper foil except the portions covered by the resists is removed. Thereafter, a cleaning solution is sprayed to remove the resists. Thus, the coil portion 22-1 and the connection conductor 24 shown in FIG. 1 are provided on the upper surface of the dielectric sheets 18-1 by photolithography.

Next, the coil portion 22-2 shown in FIG. 1 is formed on the upper surface of the dielectric sheet 18-2. The coil portion 22-3 shown in FIG. 1 is formed on the upper surface of the dielectric sheet 18-3. The signal line 20, the coil portion 22-4 and the connection conductor 26 shown in FIG. 1 are formed on the lower surface of the dielectric sheet 18-4. The processes of forming the signal line 20, the coil portions 22-2 to 22-4 and the connection conductor 26 are the same as or similar to the process of forming the coil portion 22-1 and the connection conductor 24, and descriptions of these processes are omitted.

Next, the dielectric sheets 18-1 to 18-4 are irradiated with laser beams at positions where the via-hole conductors v1 to v3 and v11 are to be provided, and thus through-holes are formed. The through-holes are filled with a conductive paste. Next, as shown in FIG. 6, the dielectric sheets 18-1 to 18-4 are stacked in this order from top to bottom, and a pressing treatment and a heating treatment are applied to the stack of dielectric sheets. By the pressing treatment and the heating treatment, the dielectric sheets 18-1 to 18-4 are softened, and at the same time, the conductive paste in the through-holes is solidified. Accordingly, the dielectric sheets 18-1 to 18-4 are bonded together, and the via-hole conductors v1 to v3 and v11 are formed.

Next, a resin paste is applied to the upper surface of the dielectric sheet 18-1 and the lower surface of the dielectric sheet 18-4 by screen printing, and thus the protective layers 19-1 and 19-2 shown in FIG. 8 are formed.

Lastly, the connectors 100a and 100b are mounted at the openings Op1 and Op2 via solder 101a and 101b, respectively.

In the above-described manufacturing method, the dielectric element assembly 12 includes dielectric sheets 18-1 to 18-4, and the coil L includes coil portions 22-1 to 22-4. However, the dielectric element assembly 12 may include k dielectric sheets 18-1 to 18-$k$ (a first insulating layer to a $k^{th}$ insulating layer), and the coil L may include k coil portions 22-1 to 22-$k$ (a first coil portion to a $k^{th}$ coil portion), where k is an integer not less than 3. In this case, the coil portion 22-$l$ (an $l^{th}$ coil portion) is formed on the $l^{th}$ dielectric sheet 18-$l$, where l is a natural number not more than k. Further, a via-hole conductor is formed in the dielectric sheet 18-$l$. Thereafter, the dielectric sheets 18-1 to 18-$k$ are stacked in this order from top to bottom, and a pressing treatment and a heating treatment are applied to the stack of dielectric sheets.

In the multilayer substrate 10a configured as described above, the capacitance generated in the coil L is relatively small. When the spaces Sp-1 to Sp-3 between the coil portions 22-1 to 22-4 are increased, the coil portions 22-1 to 22-4 are positioned away from one another, and accordingly, the capacitance generated in the coil L decreases. The amounts of decreases in capacitance are defined as follows.

Amount of decrease $\Delta C1$: The amount of decrease $\Delta C1$ is an amount of decrease in the capacitance between the coil portion 22-1 and the coil portion 22-2 due to an increase in the width w1 of the space Sp-1 by a unit length.

Amount of decrease $\Delta C2$: The amount of decrease $\Delta C2$ is an amount of decrease in the capacitance between the coil portion 22-2 and the coil portion 22-3 due to an increase in the width w2 of the space Sp-2 by the unit length.

Amount of decrease $\Delta C3$: The amount of decrease $\Delta C3$ is an amount of decrease in the capacitance between the coil portion 22-3 and the coil portion 22-4 due to an increase in the width w3 of the space Sp-3 by the unit length.

In the multilayer substrate 10a, the portion of the coil portion 22-1 extending parallel or substantially parallel to the coil portion 22-2 is longer than the portion of the coil portion 22-2 extending parallel or substantially parallel to the coil portion 22-3 and the portion of the coil portion 22-3 extending parallel or substantially parallel to the coil portion 22-4. Therefore, the amount of decrease $\Delta C1$ is greater than the amount of decrease $\Delta C2$ and the amount of decrease $\Delta C3$. Accordingly, increasing the width w1 of the space Sp-1 provides a greater decrease in the capacitance generated in the coil L than increasing the width w2 of the space Sp-2 and increasing the width w3 of the space Sp-3. Accordingly, by setting the width w1 of the space Sp1 to be greater than the width w2 of the space Sp-2 and the width w3 of the space Sp-3 when the multilayer substrate 10a is viewed from above, a decrease in the capacitance generated in the coil L is able to be provided. The decrease in the capacitance generated in the coil L provides an increase in the self-resonant frequency of the coil L.

In the multilayer substrate 10a, while the capacitance generated in the coil L is decreased, an increase in the size of the coil L is able to be significantly reduced. More specifically, in order to decrease the capacitance generated in the coil L, for example, all of the widths w1 to w3 may be increased. However, the coil L increases in size as the widths w1 to w3 are increased. In order to prevent too great an increase in size, the width w1 of the space Sp-1, which provides a greatest contribution to a decrease in the capacitance generated in the coil L, is set to be larger than the widths w2 and w3 of the other spaces Sp-2 and Sp-3. Accordingly, in the multilayer substrate 10a, an increase in the size of the coil L is significantly reduced or minimized while the capacitance generated in the coil L is decreased.

In the multilayer substrate 10a, an increase in the size of the coil L is significantly reduced or minimized while the capacitance generated in the coil L is decreased. More specifically, in the multilayer substrate 10a, the portion of the coil portion 22-2 extending parallel or substantially parallel to the coil portion 22-3 is longer than the portion of the coil portion 22-3 extending parallel or substantially parallel to the coil portion 22-4. Therefore, the amount of decrease ΔC2 is greater than the amount of decrease ΔC3. Accordingly, increasing the width w2 of the space Sp-2 provides a greater decrease in the capacitance generated in the coil L than increasing the width w3 of the space Sp-3. Accordingly, the width w2 of the space Sp-2 is set greater than the width w3 of the space Sp-3. Accordingly, in the multilayer substrate 10a, an increase in the size of the coil L is significantly reduced or minimized while the capacitance generated in the coil L is decreased.

When the multilayer substrate 10a is included in an electronic device, the multilayer substrate 10a is bent at a position where the coil L is not located. The bend of the multilayer substrate 10a does not provide significant variations in the positional relationships among the coil portions 22-1 to 22-4. Accordingly, a change in the characteristics of the coil L is able to be significantly reduced or prevented.

In the multilayer substrate 10a, a change in the characteristics of the coil L is also able to be significantly reduced or prevented. The multilayer substrate 10a is bent at a position where the coil L is not located when the multilayer substrate 10a is included in an electronic device. The deformation of the dielectric element assembly 12 due to the bend of the multilayer substrate 10a may reach a position adjacent to or in a vicinity of the coil L.

Since the space Sp-1 is the outermost space of the spaces in the coil L, the space Sp-1 is nearer from the bend position of the multilayer substrate 10a than any other spaces in the coil L. Therefore, the bend of the multilayer substrate 10a affects the width w1 of the space Sp-1 more than the widths w2 and w3 of the spaces Sp-2 and Sp-3. Accordingly, the capacitance between the coil portion 22-1 and the coil portion 22-2 is more variable than the capacitance between the coil portion 22-2 and the coil portion 22-3 and the capacitance between the coil portion 22-3 and the coil portion 22-4.

The capacitance between the coil portions 22-1 and the coil portion 22-2 is inversely proportional to the width w1. Therefore, the amount of variation in capacitance due to a change in width w1 by a unit length when the width w1 is large is smaller than the amount of variation in capacitance due to a change in width w1 by the unit length when the width w1 is relatively small. Accordingly, the width w1 of the space Sp-1 is set greater than the widths w2 and w3 of the other spaces Sp-2 and the space Sp-3. Accordingly, variations in the capacitance between the coil portion 22-1 and the coil portion 22-2 are able to be significantly reduced or prevented. Accordingly, variations in the characteristics of the coil L are able to be significantly reduced or prevented.

In the multilayer substrate 10a and in the manufacturing method thereof, the coil portions 22-1 to 22-4 are disposed on different dielectric sheets 18-1 to 18-4. This significantly reduces or prevents short-circuits among the coil portions 22-1 to 22-4.

First Modification

Figure 9:
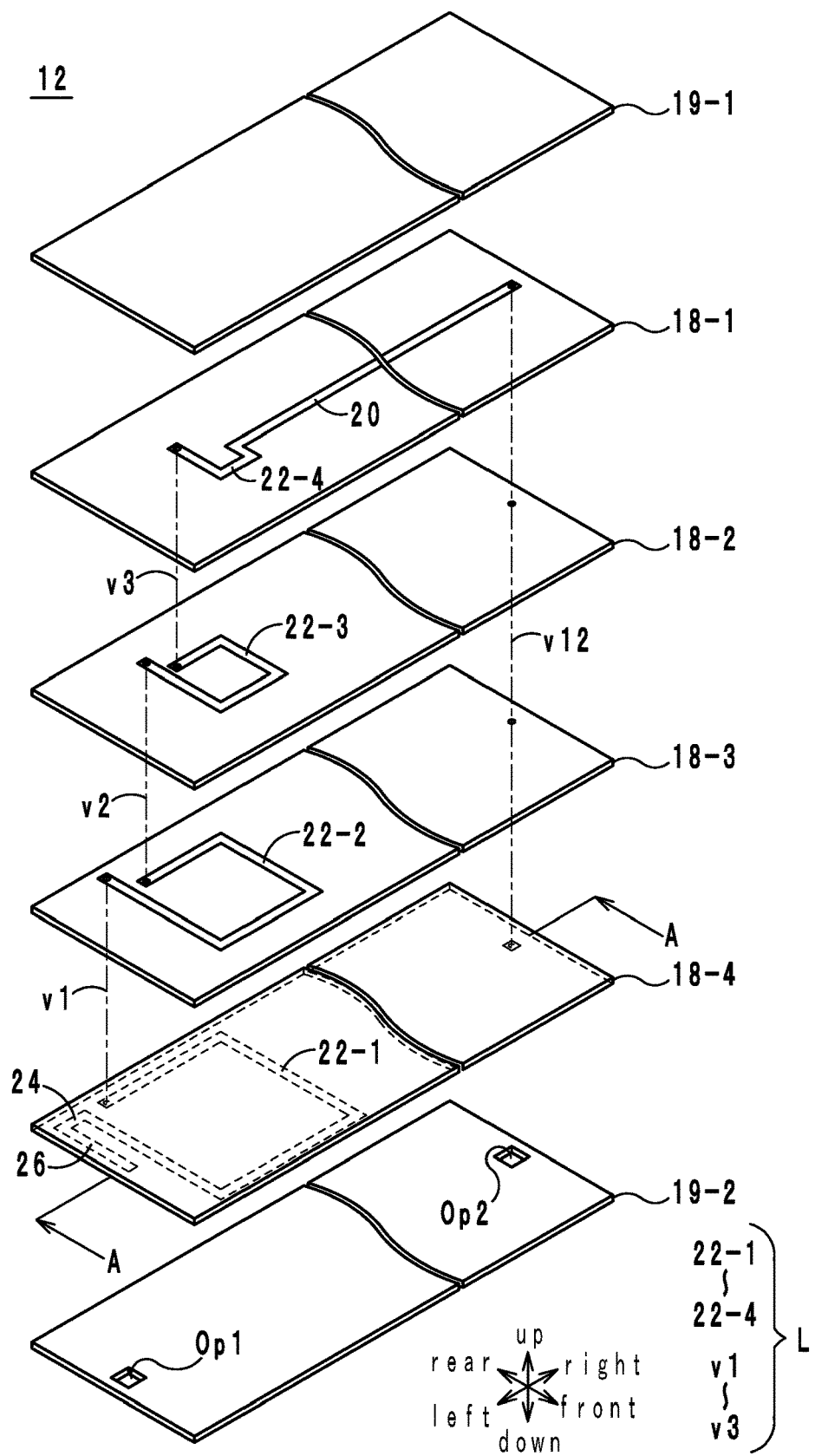
FIG. 9 is an exploded perspective view of a multilayer substrate 10*b* according to a first modification of a preferred embodiment of the present invention.
Figure 10:
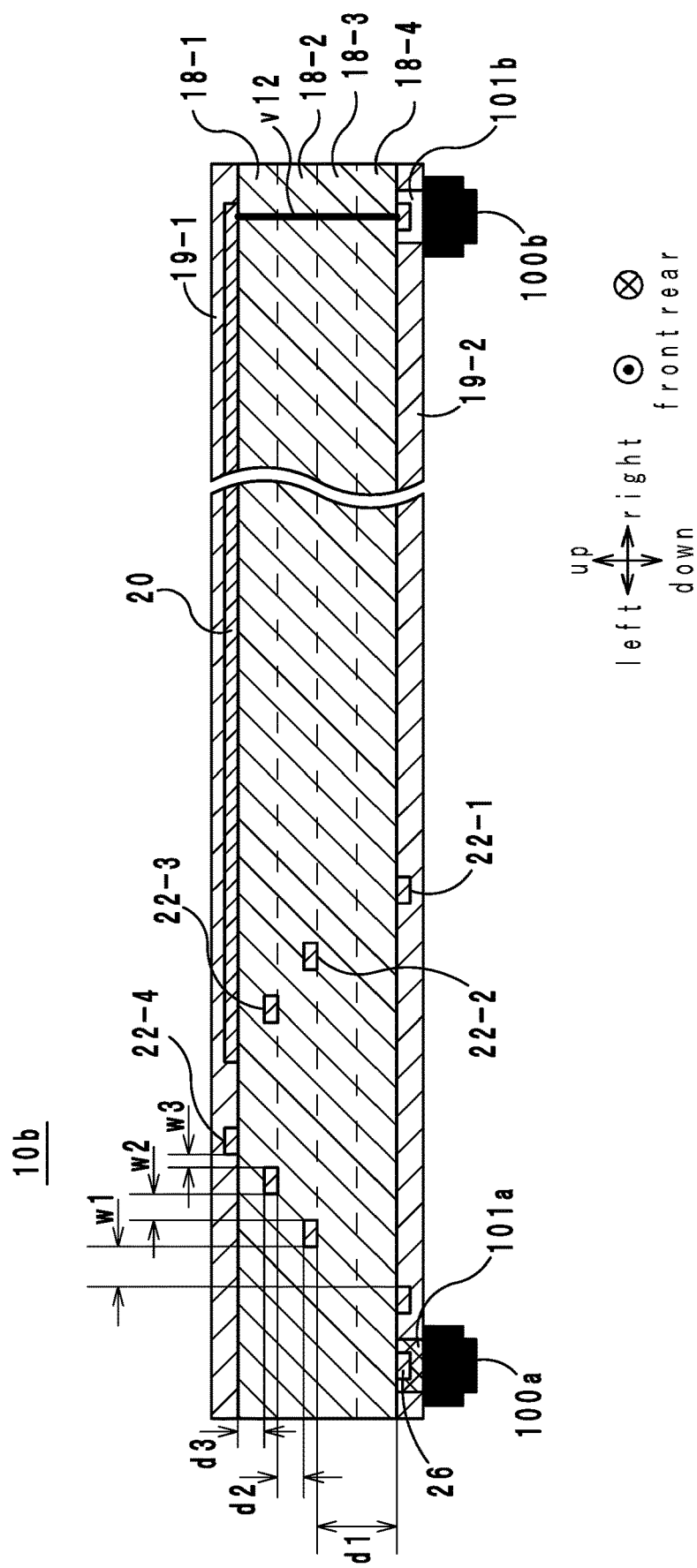
FIG. 10 is a sectional view of the multilayer substrate 10*b* along the line A-A in FIG. 9.

The structure of a multilayer substrate according to a first modification of a preferred embodiment of the present invention is described below with reference to the drawings. FIG. 9 is a perspective view of the multilayer substrate 10b according to the first modification. FIG. 10 is a sectional view of the multilayer substrate 10b along the line A-A in FIG. 9. The connectors 100a and 100b are omitted in FIG. 9 for clarity and are shown in FIG. 10.

The multilayer substrate 10b differs from the multilayer substrate 10a in a structure of the coil L. More specifically, in the multilayer substrate 10a, the coil L extends from the top downward while spiraling from the outside inward. In the multilayer substrate 10b, on the other hand, the coil L extends the bottom upward while spiraling from the outside inward. The following description of the multilayer substrate 10b focuses on this difference.

The coil L includes coil portions 22-1 to 22-4 and via-hole conductors v1 to v3. The shapes of the coil portions 22-1 to 22-4 of the multilayer substrate 10b are the same as or similar to those of the coil portions 22-1 to 22-4 of the multilayer substrate 10a, respectively. However, the locations of the coil portions 22-1 to 22-4 in the multilayer substrate 10b are different from those of the coil portions 22-1 to 22-4 in the multilayer substrate 10a. Specifically, the coil portion 22-1 is a conductor layer disposed in a left end portion of the lower surface of the dielectric sheet 18-4. The coil portion 22-3 is a conductor layer disposed in a left end portion of the upper surface of the dielectric sheet 18-3. The coil portion 22-2 is a conductor layer disposed in a left end portion of the upper surface of the dielectric sheet 18-2. The coil portion 22-4 is a conductor layer disposed in a left end portion of the upper surface of the dielectric sheet 18-1.

The via-hole conductor v1 pierces through the dielectric sheets 18-3 and 18-4 in the up-down axis to electrically connect the downstream end of the coil portion 22-1 and the upstream end of the coil portion 22-2. The via-hole conductor v2 pierces through the dielectric sheet 18-2 in the up-down axis to electrically connect the downstream end of the coil portion 22-2 and an upstream end portion of the coil portion 22-3. The via-hole conductor v3 pierces through the dielectric sheet 18-1 in the up-down axis to electrically connect the downstream end of the coil portion 22-3 and the upstream end of the coil portion 22-4.

As shown in FIG. 10, the distance d1 in the up-down axis between the coil portion 22-1 and the coil portion 22-2 is greater than the distance in the up-down axis between any two vertically adjacent coil portions of the coil portions 22-2 to 22-4. In this preferred embodiment, the distance d3 in the up-down axis between the coil portion 22-3 and the coil portion 22-4 is equal or substantially equal to the distance d2 in the up-down axis between the coil portion 22-2 and the coil portion 22-3. The distance d1 in the up-down axis between the coil portion 22-1 and the coil portion 22-2 is greater than the distances d2 and d3. A magnitude relationship among the distances d1 to d3 in the multilayer substrate 10b is different from that in the multilayer substrate 10a.

The multilayer substrate 10b provides the same or similar features and effects as the multilayer substrate 10a.

In the multilayer substrate 10b, the capacitance generated in the coil L is able to be further decreased when compared with the multilayer substrate 10a. The capacitance generated in the coil L is able to be decreased by increasing the distances d1 to d3 in the up-down axis between the coil portions 22-1 to 22-4. The amounts of decreases in capacitance are defined as follows.

Amount of decrease ΔC11: The amount of decrease ΔC11 is an amount of decrease in the capacitance between the coil portion 22-1 and the coil portion 22-2 due to an increase in the distance d1 by a unit length.

Amount of decrease ΔC12: The amount of decrease ΔC12 is an amount of decrease in the capacitance between the coil portion 22-2 and the coil portion 22-3 due to an increase in the distance d2 by the unit length.

Amount of decrease $\Delta C13$: The amount of decrease $\Delta C13$ is an amount of decrease in the capacitance between the coil portion 22-3 and the coil portion 22-4 due to an increase in the distance d3 by the unit length.

In the multilayer substrate 10b, the portion of the coil portion 22-1 extending parallel or substantially parallel to the coil portion 22-2 is longer than the portion of the coil portion 22-2 extending parallel or substantially parallel to the coil portion 22-3 and the portion of the coil portion 22-3 extending parallel or substantially parallel to the coil portion 22-4. Therefore, the amount of decrease $\Delta C11$ is greater than the amount of decrease $\Delta C12$ and the amount of decrease $\Delta C13$. Accordingly, increasing the distance d1 provides a greater decrease in the capacitance generated in the coil L than increasing the distance d2 and increasing the distance d3. Accordingly, by setting the distance d1 to be greater than the distances d2 and d3, a decrease in the capacitance generated in the coil L is able to be provided. The decrease in the capacitance generated in the coil L provides an increase in the self-resonant frequency of the coil L.

The multilayer substrate 10b also significantly reduces or prevents an increase in thickness while decreasing the capacitance generated in the coil L. More specifically, in order to decrease the capacitance generated in the coil L, for example, all of the distances d1 to d3 may be increased. However, the multilayer substrate 10b increases in thickness as the distances d1 to d3 are increased. In order to prevent too great an increase in thickness, the distance d1, which provides a greatest contribution to a decrease in the capacitance generated in the coil L, is set to be larger than the other distances d2 and d3. Accordingly, in the multilayer substrate 10b, an increase in thickness is significantly reduced while the capacitance generated in the coil L is decreased.

In the multilayer substrate 10b, the distance d1 is preferably greater than the distance d2, and the distance d2 is preferably greater than the distance d3. In this case, a significant reduction or prevention of an increase in thickness while decreasing the capacitance generated in the coil L is able to be provided. The portion of the coil portion 22-2 extending parallel or substantially parallel to the coil portion 22-3 is longer than the portion of the coil portion 22-3 extending parallel or substantially parallel to the coil portion 22-4. Accordingly, the amount of decrease $\Delta C12$ is greater than the amount of decrease $\Delta C13$. Therefore, increasing the distance d2 provides a greater decrease in the capacitance generated in the coil L than increasing the distance d3. Accordingly, the distance d2 is preferably greater than the distance d3. Thus, the multilayer substrate 10b significantly reduces or prevents an increase in thickness while decreasing the capacitance generated in the coil L.

The coil L includes four coil portions 22-1 to 22-4. However, the coil L may include, for example, n+1 coil portions 22-1 to 22-$n$+1, where n is a natural number. In this case, the distance in the up-down axis between the coil portion 22-$n$ and the coil portion 22-$n$+1 is referred as a distance dn.

As described above, the distance d1 is greater than distances d2 and d3, and the distance d2 is preferably greater than the distance d3. In general terms, a distance dm is preferably greater than a distance dm+1, where m is an integer not less than 2 and not more than n. Thus, it is preferred that the distance in the up-down axis between two vertically adjacent coil portions in an outer portion of the coil L is greater than that in an inner portion of the coil L.

Second Modification

Figure 11:
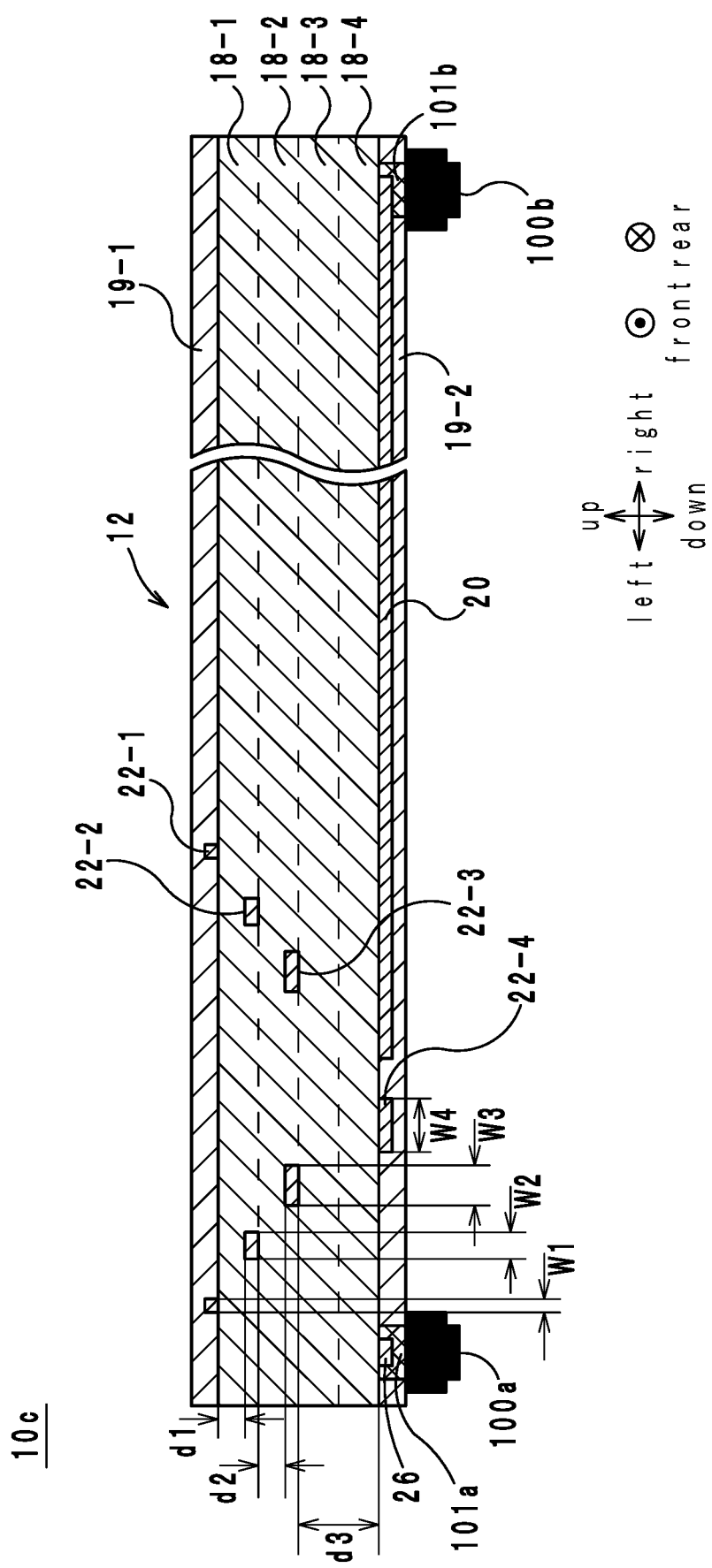
FIG. 11 is a sectional view of a multilayer substrate 10*c* according to a second modification of a preferred embodiment of the present invention.
Figure 12:
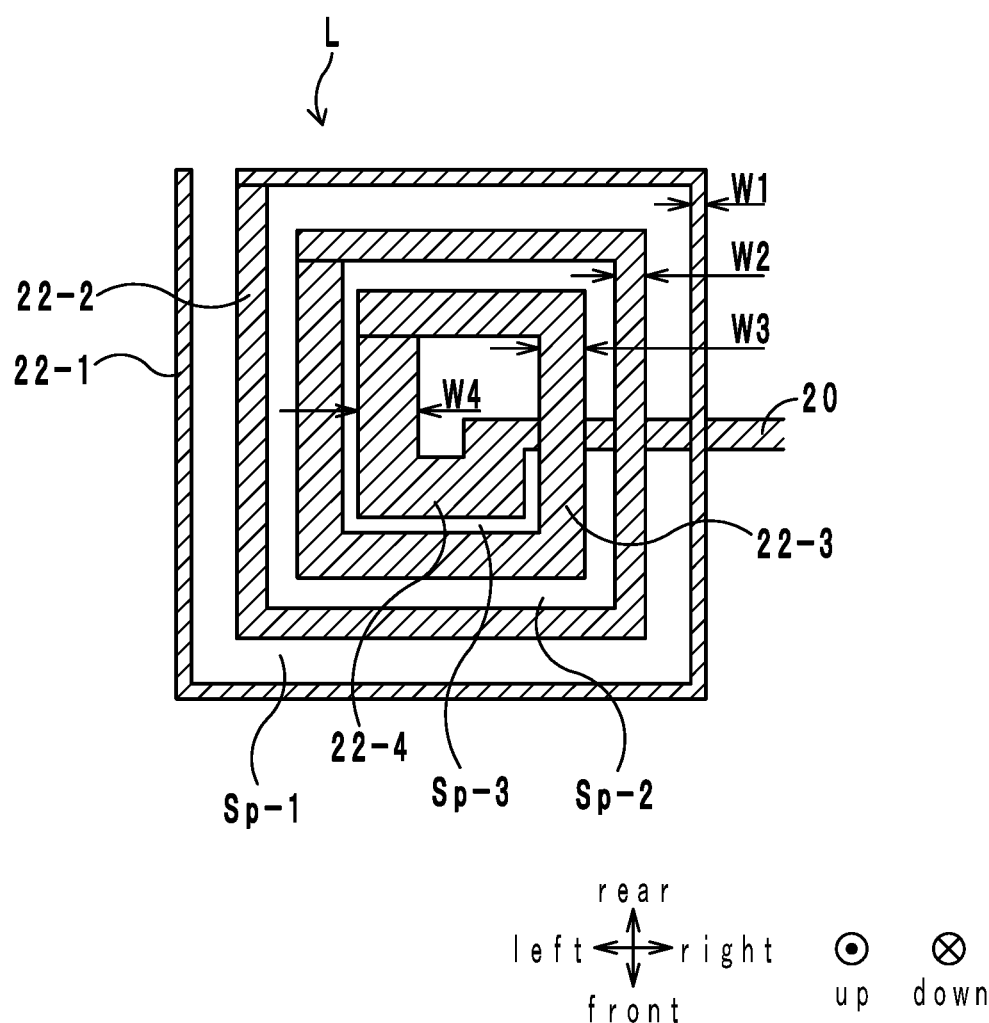
FIG. 12 is a top view of a coil L in the multilayer substrate 10*c*.

The structure of a multilayer substrate according to a second modification of a preferred embodiment of the present invention is described below with reference to the drawings. FIG. 11 is a perspective view of the multilayer substrate 10c according to the second modification. FIG. 12 is a top view of the coil L of the multilayer substrate 10c.

The multilayer substrate 10c differs from the multilayer substrate 10a in the line widths of the coil portions 22-1 to 22-4. Specifically, in the multilayer substrate 10a, the line widths W1 to W4 of the coil portions 22-1 to 22-4 are equal or substantially equal to one another. In the multilayer substrate 10c, on the other hand, the line width W1 of the coil portion 22-1 is smaller than the line widths W2 to W4 of the coil portions 22-2 to 22-4. In the second modification, the line width W1 is smaller than the line width W2, the line width W2 is smaller than the line width W3, and the line width W3 is smaller than the line width W4.

The coil L includes four coil portions 22-1 to 22-4. However, the coil L may include, for example, n+1 coil portions 22-1 to 22-$n$+1, where n is a natural number. In this case, the line width of the coil portion 22-$n$ is referred to as a line width Wn.

As shown in FIGS. 11 and 12, the line width W1 is smaller than the other line widths W2 to W4. The line width W2 is smaller than the line width W3. In general terms, when the coil L is viewed from above, the line width Wm is preferably smaller than the line width Wm+1, where m is an integer not less than 2 and not more than n. The line width of a coil portion in an outer portion of the coil L is preferably smaller than the line width of a coil portion in an inner portion of the coil L.

The multilayer substrate 10c provides the same or similar features and effects as the multilayer substrate 10a.

In the multilayer substrate 10c, the capacitance generated in the coil L is able to be further decreased when compared with the multilayer substrate 10a. When the line widths W1 to W4 of the coil portions 22-1 to 22-4 are decreased, the area where the coil portions 22-1 to 22-4 face each other is decreased, and accordingly the capacitance generated in the coil L is decreased. The amounts of decreases in capacitance are defined as follows.

Amount of decrease $\Delta C21$: The amount of decrease $\Delta C21$ is an amount of decrease in the capacitance between the coil portion 22-1 and the coil portion 22-2 due to an increase in the line width W1 by a unit length.

Amount of decrease $\Delta C22$: The amount of decrease $\Delta C22$ is an amount of decrease in the capacitance between the coil portion 22-2 and the coil portion 22-3 due to an increase in the line width W2 by the unit length.

Amount of decrease $\Delta C23$: The amount of decrease $\Delta C23$ is an amount of decrease in the capacitance between the coil portion 22-3 and the coil portion 22-4 due to an increase in the line width W3 by the unit length.

In the multilayer substrate 10c, the portion of the coil portion 22-1 extending parallel or substantially parallel to the coil portion 22-2 is longer than the portion of the coil portion 22-2 extending parallel or substantially parallel to the coil portion 22-3 and the portion of the coil portion 22-3 extending parallel or substantially parallel to the coil portion 22-4. Therefore, the amount of decrease $\Delta C21$ is greater than the amount of decrease $\Delta C22$ and the amount of decrease $\Delta C23$. Accordingly, decreasing the line width W1 provides a greater decrease in the capacitance generated in the coil L than decreasing the line width W2 and decreasing the line width W3. Accordingly, by setting the line width W1 to be greater than the line widths W2 and W3 when the multilayer substrate 10c is viewed from above, a decrease in the capacitance generated in the coil L is able to be provided. The decrease in the capacitance generated in the coil L provides an increase in the self-resonant frequency of the coil L.

The multilayer substrate 10c also significantly reduces or prevents an increase in the DC resistance of the coil L while decreasing the capacitance generated in the coil L. More specifically, in order to decrease the capacitance generated in the coil L, for example, all of the line widths W1 to W4 may be decreased. However, the DC resistance of the coil L increases as the line widths W1 to W4 are decreased. In order to prevent too great an increase in the DC resistance of the coil L, the line width W1, which provides a greatest contribution to a decrease in the capacitance generated in the coil L, is set to be smaller than the other line widths W2 to W4. Accordingly, in the multilayer substrate 10c, an increase in the DC resistance of the coil L is significantly reduced while the capacitance generated in the coil L is decreased.

The multilayer substrate 10c significantly reduces or prevents an increase in the DC resistance of the coil L while decreasing the capacitance generated in the coil L. In the multilayer substrate 10c, the portion of the coil portion 22-2 extending parallel or substantially parallel to the coil portion 22-3 is longer than the portion of the coil portion 22-3 extending parallel or substantially parallel to the coil portion 22-4. Therefore, the amount of decrease $\Delta C22$ is greater than the amount of decrease $\Delta C23$. Accordingly, decreasing the line width W2 provides a greater decrease in the capacitance generated in the coil L than decreasing the line width W3. Accordingly, the line width W2 is smaller than the line width W3. Thus, in the multilayer substrate 10c, an increase in the DC resistance of the coil L is significantly reduced or minimized while the capacitance generated in the coil L is decreased.

Third Modification

Figure 13:
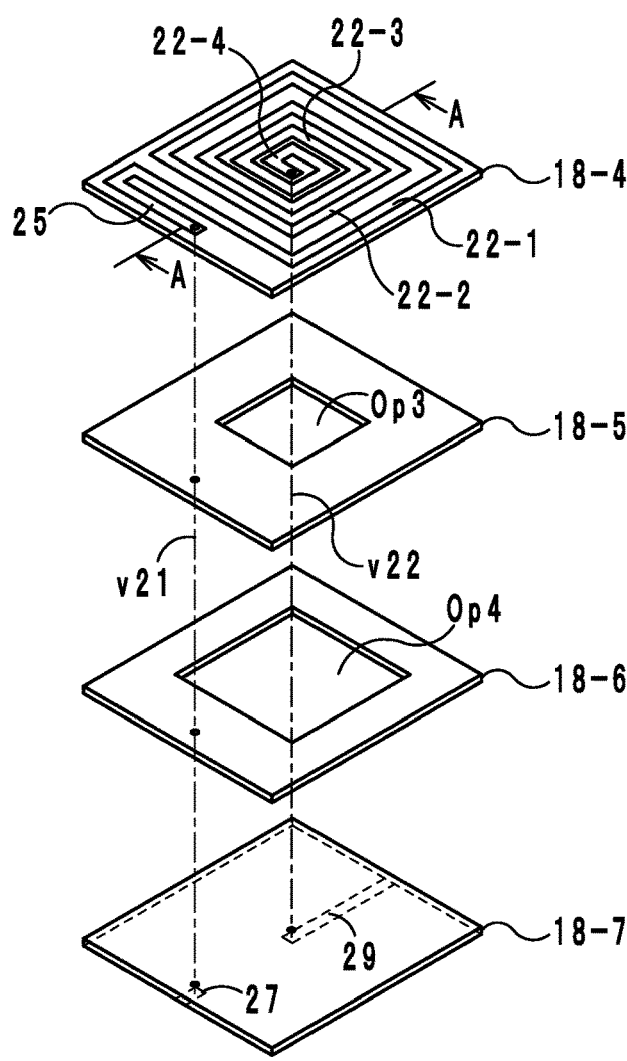
FIG. 13 is an exploded perspective view of a multilayer substrate 10*d* according to a third modification of a preferred embodiment of the present invention.
Figure 14:
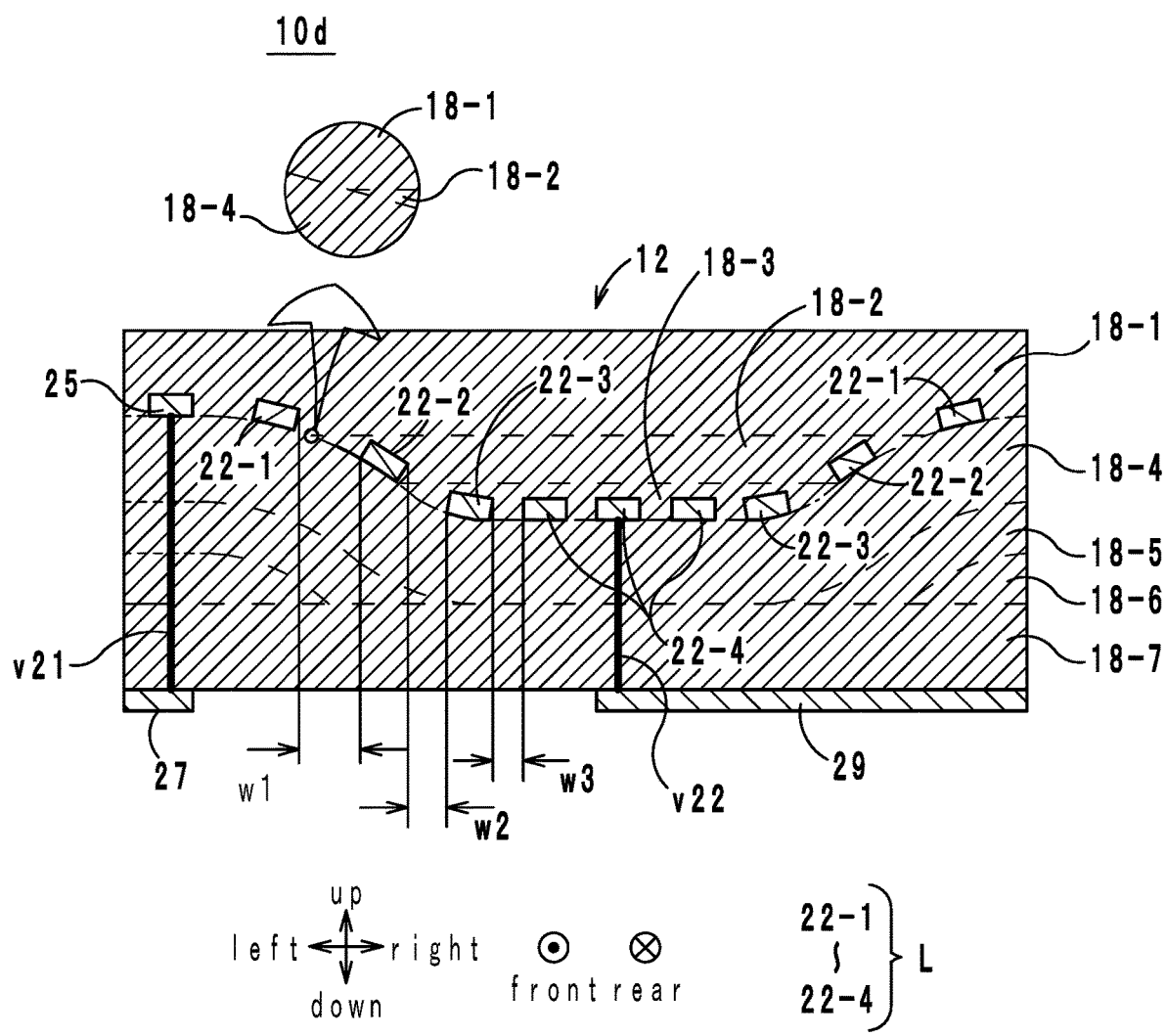
FIG. 14 is a sectional view of the multilayer substrate 10*d* along the line A-A in FIG. 13.
Figure 15:
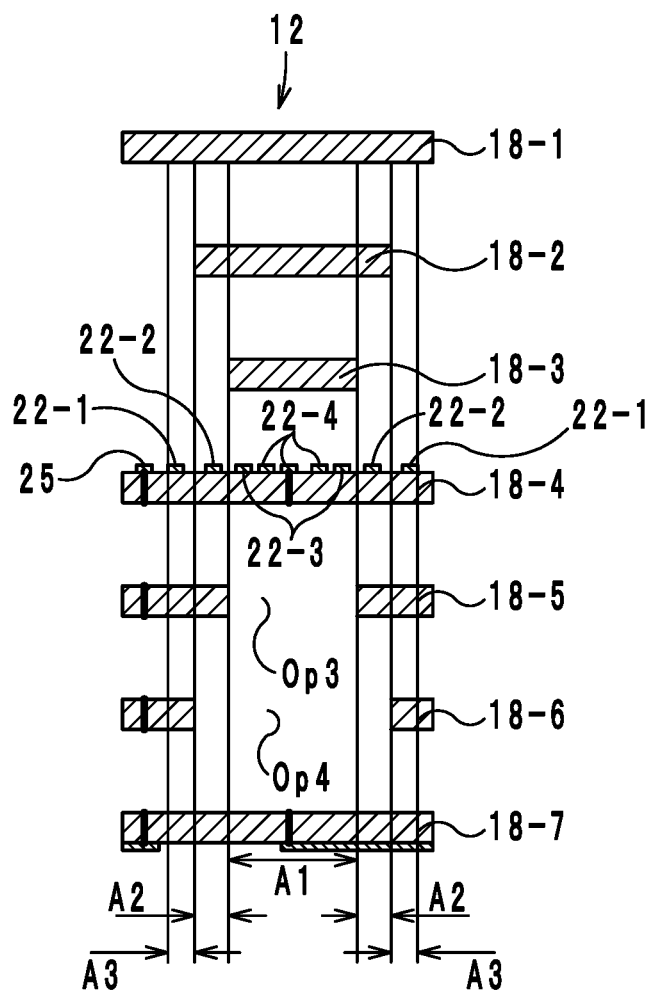
FIG. 15 is an exploded view of the multilayer substrate 10*d* according to the third modification of a preferred embodiment of the present invention.

The structure of a multilayer substrate according to a third modification of a preferred embodiment of the present invention is described below with reference to the drawings. FIG. 13 is an exploded perspective view of the multilayer substrate 10d according to the third modification. FIG. 14 is a sectional view of the multilayer substrate 10d along the line A-A in FIG. 13. FIG. 15 is an exploded view of the multilayer substrate 10d. In the following description, the direction in which layers of the multilayer substrate 10d are stacked is referred to as an up-down axis, the longitudinal direction of the multilayer substrate 10d is referred to as a right-left axis, and the lateral direction of the multilayer substrate 10d is referred to as a front-rear axis. The up-down axis, the right-left axis, and the front-rear axis are perpendicular or substantially perpendicular to each other.

As shown in FIGS. 13 and 14, the multilayer substrate 10d includes a dielectric element assembly 12, connection conductors 25, 27 and 29, via-hole conductors v21 and v22, and a coil L.

As shown in FIG. 13, the dielectric element assembly 12 is a flexible rectangular or substantially rectangular plate member extending in the right-left axis when viewed from above. The dielectric element assembly 12 is, as shown in FIG. 13, a multilayered body including dielectric sheets 18-1 to 18-7 stacked in this order from top to bottom. An upper principal surface of the dielectric element assembly 12 is referred to as a top surface, and a lower principal surface of the dielectric element assembly 12 is referred to as a bottom surface.

As shown in FIG. 13, each of the dielectric sheets 18-1, 18-4, and 18-7 includes the same or a similar shape as the element assembly 12 when viewed from above. The dielectric sheet 18-2 includes a rectangular or substantially rectangular shape that is smaller than the dielectric sheet 18-1, and lies within the outer periphery of the dielectric sheet 18-1 when viewed from above. The dielectric sheet 18-3 includes a rectangular or substantially rectangular shape that is smaller than the dielectric sheet 18-2, and lies within the outer periphery of the dielectric sheet 18-2 when viewed from above. The outer periphery of each of the dielectric sheets 18-5 and 18-6 includes the same or a similar shape as the outer periphery of the element assembly 12 when viewed from above. However, the dielectric sheet 18-5 includes an opening Op3 with a similar or same size and shape as the dielectric sheet 18-3 when viewed from above. The dielectric sheet 18-6 includes an opening Op4 with a similar or same size and shape as the dielectric sheet 18-2 when viewed from above. The dielectric sheets 18-1 to 18-7 include, for example, flexible thermoplastic resin such as polyimide, liquid crystal polymer or the like. An upper principal surface of each of the dielectric sheets 18-1 to 18-7 is referred to as an upper surface, and a lower principal surface of each of the dielectric sheets 18-1 to 18-7 is referred to as a lower surface.

The coil L is a conductor layer disposed on the upper surface of the dielectric sheet 18-4 (a first insulating layer) of the dielectric element assembly 12. The coil L includes a spiral of more than two turns, three and five eighth turns in the present preferred embodiment, for example, when viewed above, and the coil L extends from the top downward while spiraling from the outside inward.

The coil L includes coil portions 22-1 to 22-4. The coil portion 22-1 (a first coil portion) defines the outermost one-turn of the coil L. The coil portion 22-2 (a second coil portion) is an inner portion that is the nearest from the coil portion 22-1. The coil portion 22-3 (a third coil portion) is an inner portion that is the second nearest from the coil portion 22-1. The coil portion 22-4 (a fourth coil portion) is an inner portion that is the third nearest from the coil portion 22-1.

Each of the coil portions 22-1 to 22-3 includes a length corresponding to about one turn and includes a rectangular or substantially rectangular shape with a cutout. In the present preferred embodiment, each of the coil portions 22-1 to 22-3 includes a cutout at the left end of the rear side. The coil portion 22-4 includes a length corresponding to about five eighth turns. An upstream end in the counterclockwise direction of each of the coil portions 22-1 to 22-4 is referred to as an upstream end, and a downstream end in the counterclockwise direction of each of the coil portions 22-1 to 22-4 is referred to as a downstream end.

A length of a portion of the coil portion 22-1 extending in the front-rear axis is longer than a length of a portion of the coil portion 22-2 extending in the front-rear axis, and a length of a portion of the coil portion 22-1 extending in the right-left axis is longer than a length of a portion of the coil portion 22-2 extending in the right-left axis. The length of a portion of the coil portion 22-2 extending in the front-rear axis is longer than a length of a portion of the coil portion 22-3 extending in the front-rear axis, and the length of a portion of the coil portion 22-2 extending in the right-left axis is longer than a length of a portion of the coil portion 22-3 extending in the right-left axis. The length of a portion of the coil portion 22-3 extending in the front-rear axis is longer than a length of a portion of the coil portion 22-4 extending in the front-rear axis, and the length of a portion of the coil portion 22-3 extending in the right-left axis is longer than a length of a portion of the coil portion 22-4 extending in the right-left axis. The coil portions 22-1 to 22-4 are equal or substantially equal in line width, and each of the coil portions 22-1 to 22-4 includes a constant or substantially constant line width over their respective lengths.

As shown in FIG. 13, the downstream end of the coil portion 22-1 is electrically connected to the upstream end of the coil portion 22-2. The downstream end of the coil portion 22-2 is electrically connected to the upstream end of the coil portion 22-3. The downstream end of the coil portion 22-3 is electrically connected to the upstream end of the coil portion 22-4.

The shape of the coil L in the multilayer substrate 10d when viewed from above is the same as or similar to the shape of the coil L in the multilayer substrate 10a when viewed from above, for example, as shown in FIG. 3). Therefore, descriptions of the line widths W1 to W4 of the coil portions 22-1 to 22-4 and the spaces Sp-1 to Sp-3 between the coil portions 22-1 to 22-4 are omitted here.

The connection conductor 25 is a conductor layer disposed on the upper surface of the dielectric sheet 18-4, and extends from the upstream end of the coil portion 22-1 leftward and then frontward. The connection conductor 27 is a conductor layer disposed on the lower surface of the dielectric sheet 18-7, near the center of the left side, and extends in the right-left axis. When the multilayer substrate 10d is viewed from above, a front end of the connection conductor 25 at least partially overlaps the right end of the connection conductor 27.

The via-hole conductor v21 pierces through the dielectric sheets 18-4 to 18-7 in the up-down axis to electrically connect the front end of the connection conductor 25 and the right end of the connection conductor 27.

The connection conductor 29 is a conductor layer disposed on the lower surface of the dielectric sheet 18-7, and extends from the center of the dielectric sheet 18-7 rightward. When the multilayer substrate 10d is viewed from above, the left end of the connection conductor 29 at least partially overlaps the downstream end of the coil portion 22-4.

The via-hole conductor v22 pierces through the dielectric sheets 18-4 to 18-7 in the up-down axis to electrically connect the downstream end of the coil portion 22-4 and the left end of the connection conductor 29.

In the multilayer substrate 10d, the coil L is disposed on the upper surface of the dielectric sheet 18-4. Therefore, the coil L is flat or substantially flat before stacking and pressure bonding of the dielectric sheets to form the dielectric element assembly 12. However, after the stacking and pressure bonding, as shown in FIG. 14, the coil L extends from the top downward while spiraling from the outside inward. A technique to provide the spiral of the coil L is described below.

As shown in FIG. 15, the area where the innermost portion of the coil L is located is referred to as an area A1, the portion adjacently outside of the area A1 is referred to as an area A2, the portion adjacently outside of the area A2 is referred to as an area A3. The area A1 includes the coil portions 22-3 and 22-4. The area A2 includes the coil portion 22-2. The border between the area A1 and the area A2 is located between the coil portion 22-2 and the coil portion 22-3. The area A3 includes the coil portion 22-1. The border between the area A2 and the area A3 is located between the coil portion 22-1 and the coil portion 22-2. Thus, the area A1 is an area including a relatively inner portion of the coil L, and the area A3 is an area including a relatively outer portion of the coil L.

The dielectric sheet 18-2 is placed over the dielectric sheet 18-4 (a first insulating layer) to at least partially overlap the areas A1 and A2 and not to overlap the area A3. The dielectric sheet 18-3 is placed over the dielectric sheet 18-4 (a first insulating layer) to at least partially overlap the area A1 and not to overlap the areas A2 and A3. Accordingly, the dielectric sheets 18-2 and 18-3 (a second insulating layers) as a whole at least partially overlap the areas A1 and A2 and do not overlap the area A3.

The dielectric sheet 18-6 is laid under the dielectric sheet (a first insulating layer) to at least partially overlap the area A3 and not to overlap the areas A1 and A2. Accordingly, the periphery of the opening Op4 includes a similar or same size and shape as the outer periphery of the area A2. The dielectric sheet 18-5 is laid under the dielectric sheet (a first insulating layer) to at least partially overlap the areas A2 and A3 and not to overlap the area A1. Accordingly, the periphery of the opening Op3 includes a similar or same size and shape as the outer periphery of the area A1. The dielectric sheets 18-5 and 18-6 (a third insulating sheets) as a whole do not overlap the area A1 and at least partially overlap the areas A2 and A3.

When the dielectric sheets 18-1 to 18-7 are stacked and pressure-bonded together, as shown in FIG. 14, the coil portions 22-3 and 22-4 are pressed down by the dielectric sheets 18-2 and 18-3 and shift downward. The coil portions 22-2 is pressed down by the dielectric sheet 18-2 and pressed up by the dielectric sheet 18-5. The coil portion 22-1 is pressed up by the dielectric sheet 18-6 and shifts upward. Accordingly, as shown in FIG. 14, the coil portions 22-1 to 22-4 are arranged from the top downward in this order. In the present preferred embodiment, however, the coil portion 22-3 and the coil portion 22-4 are substantially in the same position in the up-down axis. According to the above-described structure of the dielectric sheets 18-1 to 18-7, the coil L is able to be formed into a conical spiral.

A method for manufacturing the multilayer substrate 10d is described below with reference to the drawings. A case of manufacturing one multilayer substrate 10d is described below as an example. However, preferably, large-sized dielectric sheets are stacked and cut, and thus a plurality of multilayer substrates 10a are able to be manufactured at a time.

First, dielectric sheets 18-2, 18-3, 18-5 and 18-6 are prepared. Specifically, a large-sized dielectric sheet is punched, and thus the dielectric sheets 18-2, 18-3, 18-5 and 18-6 including the shapes shown in FIG. 13 are provided.

Next, dielectric sheets 18-4 and 18-7 including thermoplastic resin, each of which includes a sheet of copper foil located entirely or substantially entirely on one principle surface, are prepared. Specifically, a sheet of copper foil is applied onto the upper surface of the dielectric sheet 18-4. A sheet of copper foil is applied onto the lower surface of the dielectric sheet 18-7. Further, the sheets of copper foil on the dielectric sheets 18-4 and 18-7 are galvanized and smoothed. The dielectric sheets 18-1 to 18-4 are liquid crystal polymer, for example.

Next, the copper foil provided on the dielectric sheet 18-4 is patterned, and thus the coil portions 22-1 to 22-4 (coil L) and the connection conductor 25 are formed on the upper surface of the dielectric sheet 18-4 as shown in FIG. 13. Specifically, resists that are the same or similar shapes as the coil portions 22-1 to 22-4 and the connection conductor 25, respectively, are printed on the copper foil on the upper surface of the dielectric sheet 18-4. Next, the copper foil is etched, and the copper foil except the portions covered by the resists is removed. Thereafter, a cleaning solution is sprayed to remove the resists. Thus, the coil portions 22-1 to 22-4 and the connection conductor 25 shown in FIG. 13 are provided on the upper surface of the dielectric sheets 18-4 by photolithography.

Next, the connection conductors 27 and 29 are formed on the lower surface of the dielectric sheet 18-7 as shown in FIG. 13. The process of forming the connection conductors 27 and 29 is the same as or similar to the process of forming the coil portions 22-4 and the connection conductor 25, and a description of the process is omitted.

Next, the dielectric sheets 18-4 to 18-7 are irradiated with laser beams at positions where the via-hole conductors v21 and v22 are to be provided, and thus through-holes are formed. The through-holes are filled with a conductive paste.

Next, as shown in FIG. 13, the dielectric sheets 18-1 to 18-7 are stacked in this order from top to bottom, and a pressing treatment and a heating treatment are applied to the stack of dielectric sheets. When the dielectric sheets 18-1 to 18-7 are stacked, the dielectric sheets 18-2, 18-3, 18-5 and 18-6 are positioned as follows. The dielectric sheet 18-3 is placed on the dielectric sheet 18-4 with the dielectric sheet 18-3 at least partially overlapping the area A1 and not overlapping the areas A2 and A3. The dielectric sheet 18-2 is placed on the dielectric sheet 18-3 with the dielectric sheet 18-2 at least partially overlapping the areas A1 and A2 and not overlapping the area A3. The dielectric sheet 18-5 is laid under the dielectric sheet 18-4 with the dielectric sheet 18-5 at least partially overlapping the areas A2 and A3 and not overlapping the area A1. The dielectric sheet 18-6 is laid under the dielectric sheet 18-5 with the dielectric sheet 18-6 at least partially overlapping the area A3 and not overlapping the areas A1 and A2.

Thereafter, the stack of dielectric sheets 18-1 to 18-7 is pressed from above and below while being heated. Accordingly, the dielectric sheets 18-1 to 18-7 are softened, and at the same time, the conductive paste in the through-holes is solidified. Further, the coil L is deformed into a conical spiral. Then, the dielectric sheets 18-1 to 18-7 are bonded together, and the via-hole conductors v21 and v22 are formed. Thus, the multilayer substrate 10d is completed.

The multilayer substrate 10d provides the same or similar features and effects as the multilayer substrate 10a.

In the multilayer substrate 10d, the coil L is not formed of conductor layers electrically connected by via-hole conductors, but is one conductor layer disposed on one dielectric sheet 18-4. Therefore, the DC resistance of the coil L is able to be decreased, and the risk of disconnection in the coil L is able to be reduced.

In the multilayer substrate 10d, all of the dielectric sheets 18-1 to 18-7 include the same material, for example, liquid crystal polymer. Therefore, when the dielectric sheets 18-1 to 18-7 are stacked and press-bonded together, the dielectric sheets 18-1 to 18-7 are able to be fused together strongly. Thus, delamination of the multilayer substrate 10d is able to be significantly reduced or prevented.

In the multilayer substrate 10d, the top surface of the dielectric element assembly 12 becoming wavy is able to be significantly reduced or prevented. Specifically, as shown in the enlarged view of FIG. 14, if the dielectric sheet 18-1 is not present, the upper surface of the dielectric sheet 18-2 and the upper surface of the dielectric sheet 18-4 define the top surface of the dielectric element assembly 12. In this case, the dielectric sheet 18-4 is at least partially located under the dielectric sheet 18-2, and the border between the dielectric sheet 18-2 and the dielectric sheet 18-4 is recessed.

In the multilayer substrate 10d, the dielectric sheet 18-1 (a fourth insulating layer) is placed on the stack of dielectric sheets 18-2 to 18-4 to cover the upper surfaces of the dielectric sheets 18-2 and 18-4 entirely or substantially entirely. Accordingly, the recess at the border between the dielectric sheet 18-2 and the dielectric sheet 18-4 is covered by the dielectric sheet 18-1. Then, the top surface of the dielectric element assembly 12 becoming wavy is able to be significantly reduced or prevented.

In the multilayer substrate 10d, also, the dielectric sheet 18-7 is placed under the stack of dielectric sheets 18-4 to 18-6 to cover the lower surfaces of the dielectric sheets 18-4 to 18-6 entirely or substantially entirely. Accordingly, a recess at the border between the dielectric sheet 18-4 and the dielectric sheet 18-5, and a recess at the border between the dielectric sheet 18-5 and the dielectric sheet 18-6 are covered by the dielectric sheet 18-7. Thus, the bottom surface of the dielectric element assembly 12 becoming wavy is able to be significantly reduced or prevented.

In the multilayer substrate 10d, the border between the area A1 and the area A2 is located between the coil portion 22-2 and the coil portion 22-3. Accordingly, the outer periphery of the dielectric sheet 18-3 is located between the coil portion 22-2 and the coil portion 22-3. Then, the coil portion 22-3 is covered by the dielectric sheet 18-3, while the coil portion 22-2 is not covered by the dielectric sheet 18-3. Thus, the dielectric sheet 18-3 intervenes between the coil portion 22-2 and the coil portion 22-3, which ensures insulation of the coil portions from each other. The same applies to the coil portion 22-3 and the coil portion 22-4.

In the multilayer substrate 10d and in the manufacturing method thereof, the dielectric sheets 18-5 and 18-6 may be included while the dielectric sheets 18-2 and 18-3 may not be included, for example. Alternatively, the dielectric sheets 18-2 and 18-3 may be included while the dielectric sheets 18-5 and 18-6 may not be included, for example. In other words, at least either the couple of dielectric sheets 18-2 and 18-3 or the couple of dielectric sheets 18-5 and 18-6 is preferable.

In the multilayer substrate 10d and in the manufacturing method thereof, the order of stacking the dielectric sheets 18-1 to 18-3 may be changed. The order of stacking the dielectric sheets 18-5 to 18-7 may be changed.

Fourth Modification

Figure 16:
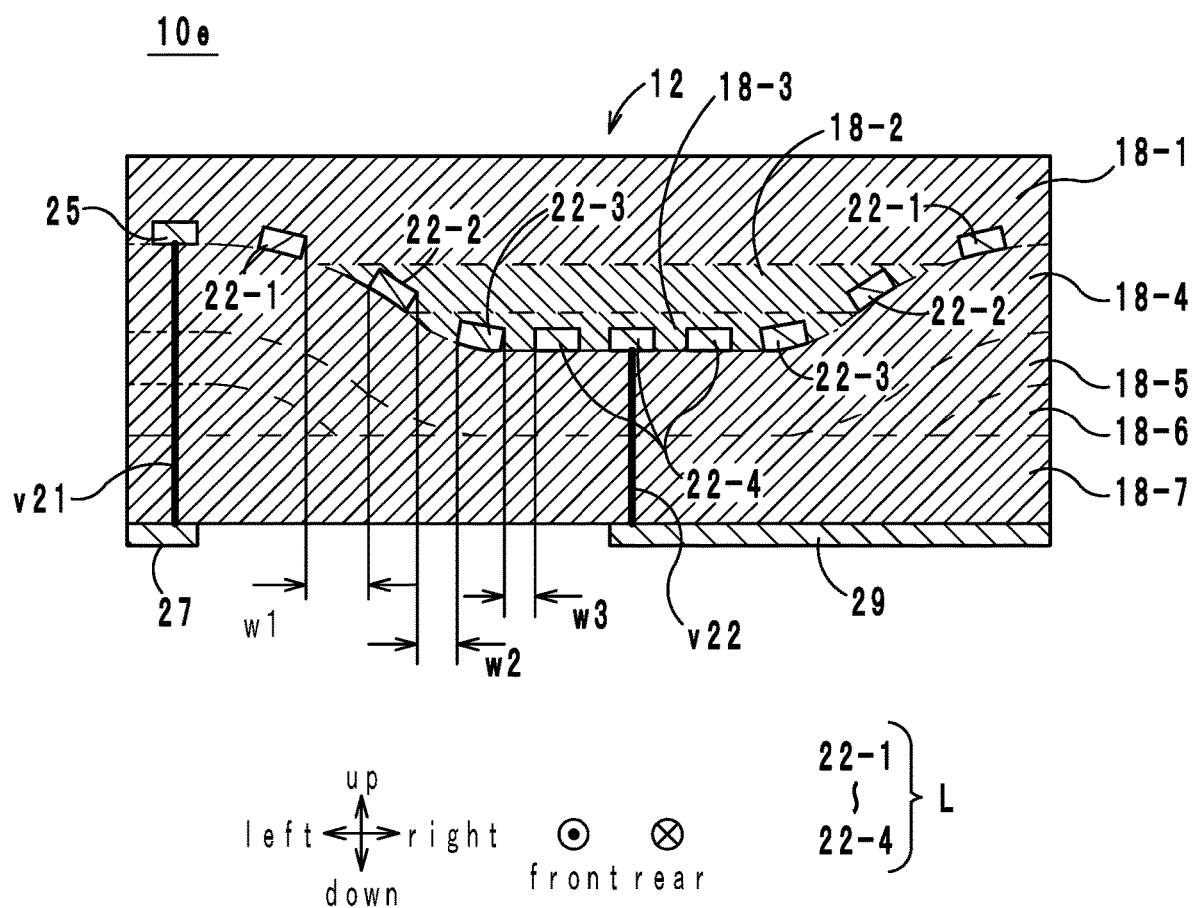
FIG. 16 is a sectional view of a multilayer substrate 10*e* according to a fourth modification of a preferred embodiment of the present invention.

The structure of a multilayer substrate according to a fourth modification of a preferred embodiment of the present invention is described below with reference to the drawings. FIG. 16 is a sectional view of the multilayer substrate 10e according to the fourth modification.

The multilayer substrate 10e differs from the multilayer substrate 10d in the materials included in the dielectric sheets 18-2 and 18-3. Specifically, in the multilayer substrate 10d, the dielectric sheets 18-1 to 18-7 include the same material, for example, a liquid crystal polymer. However, in the multilayer substrate 10e, the dielectric sheets 18-1 and 18-4 to 18-7 include liquid crystal polymer, while the dielectric sheets 18-2 and 18-3 include PTFE (fluororesin), for example. Accordingly, the dielectric constant of the dielectric sheets 18-2 and 18-3 (second insulating layers) is lower than the dielectric constant of the dielectric sheets 18-1 and 18-4 to 18-7.

The multilayer substrate 10e provides the same or similar features and effects as the multilayer substrate 10d.

Further, since the dielectric sheets 18-2 and 18-3 of the multilayer substrate 10e, which are located in an inner area of the coil L, have a relatively low dielectric constant, the capacitance generated in the coil L is able to be decreased.

Fifth Modification

Figure 17:
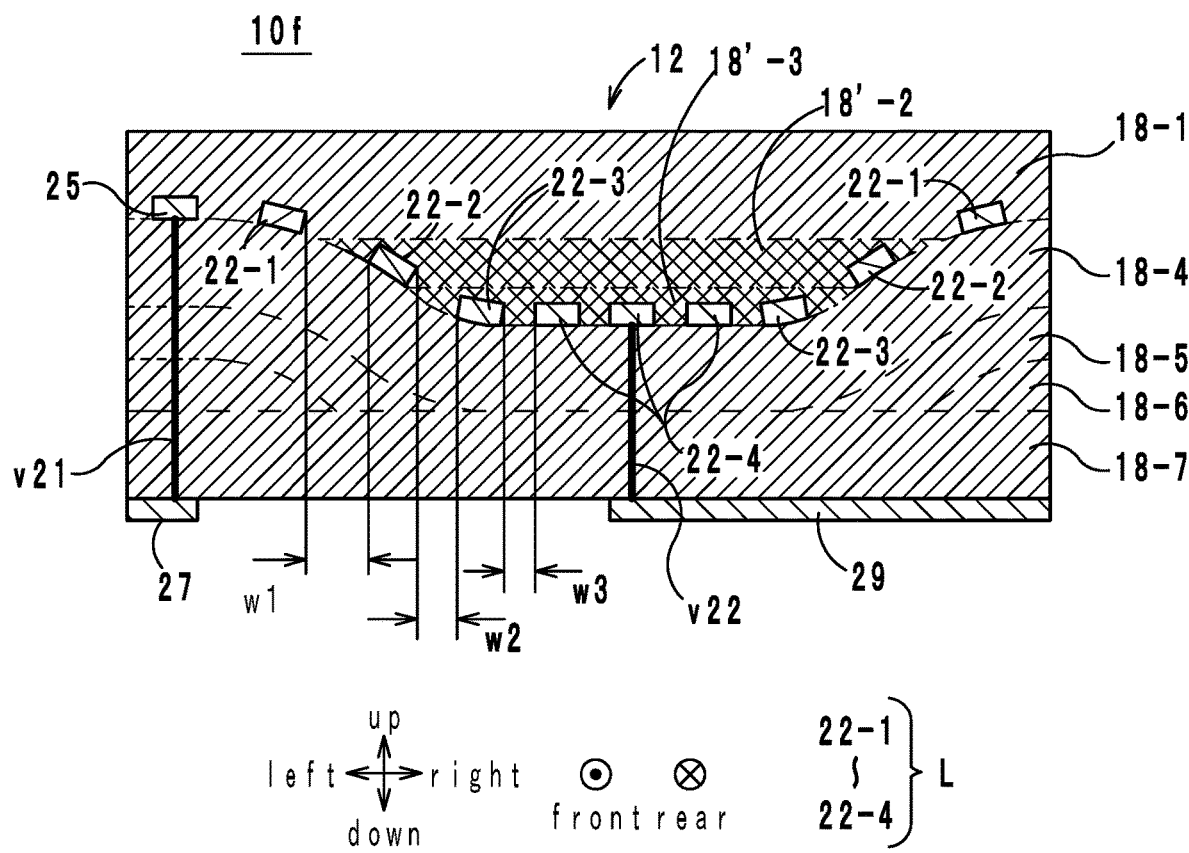
FIG. 17 is a sectional view of a multilayer substrate 10*f* according to a fifth modification of a preferred embodiment of the present invention.

The structure of a multilayer substrate according to a fifth modification of a preferred embodiment of the present invention is described below with reference to the drawings. FIG. 17 is a sectional view of the multilayer substrate 10f according to the fifth modification.

The multilayer substrate 10f differs from the multilayer substrate 10a in that the multilayer substrate 10f includes magnetic sheets 18'-2 and 18'-3 instead of the dielectric sheets 18-2 and 18-3. The magnetic sheets 18'-2 and 18'-3 are, for example, sheets of liquid crystal polymer with ferrite particles dispersed therein. Accordingly, the permeability of the magnetic sheets 18'-2 and 18'-3 (second insulating layers) is higher than the permeability of the dielectric sheets 18-1 and 18-4 to 18-7.

The multilayer substrate 10f provides the same or similar features and effects as the multilayer substrate 10d.

Further, since the magnetic sheets 18'-2 and 18'-3 of the multilayer substrate 10f, which are located in an inner area of the coil L, include a high permeability, the inductance of the coil L is able to be increased.

The magnetic sheets 18'-2 and 18'-3 may be replaced with a magnetic core, for example, made of ferrite or the like. The core is not flexible.

Sixth Modification

Figure 18:
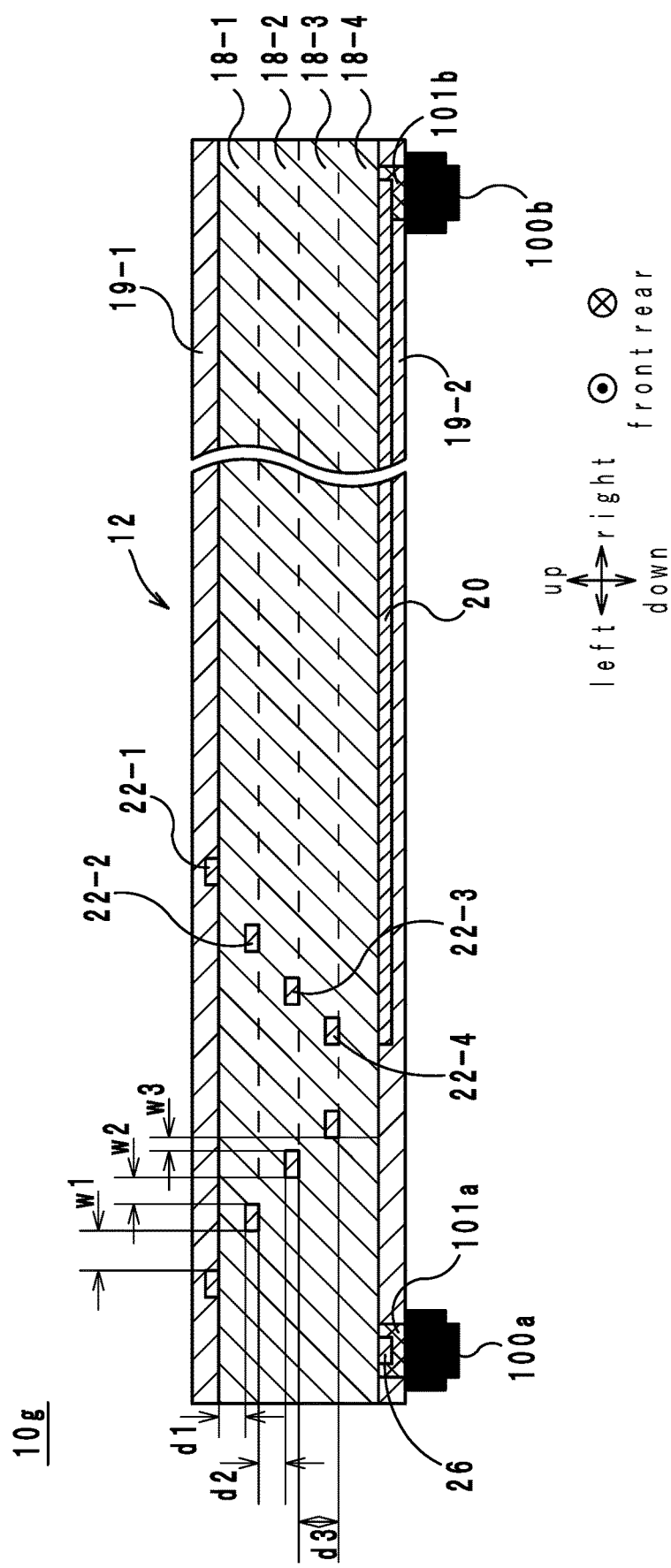
FIG. 18 is a sectional view of a multilayer substrate 10*g* according to a sixth modification of a preferred embodiment of the present invention.

The structure of a multilayer substrate according to a sixth modification of a preferred embodiment of the present invention is described below with reference to the drawings. FIG. 18 is a sectional view of the multilayer substrate 10g according to the sixth modification.

The multilayer substrate 10g differs from the multilayer substrate 10a in the location of the coil portion 22-4. Specifically, in the multilayer substrate 10a, the coil portion 22-4 is disposed on the lower surface of the dielectric sheet 18-4. In the multilayer substrate 10g, however, the coil portion 22-4 is disposed on the upper surface of the dielectric sheet 18-4. Accordingly, the distances d1 to d3 are equal or substantially equal to one another.

The multilayer substrate 10g provides the same or similar features and effects as the multilayer substrate 10a.

Other Preferred Embodiments

Multilayer substrates and methods for manufacturing multilayer substrates according to the preferred embodiments of the present invention are not limited to the above-described multilayer substrates 10a to 10g and the above-described manufacturing methods, and various changes and modifications are possible without departing from the scope and spirit of the present invention.

The elements of the multilayer substrates 10a to 10g may be arbitrarily combined, for example.

The widths w2 and w3 of the spaces Sp-2 and Sp-3 may be equal or substantially equal to each other, for example. The line widths W2 to W4 of the coil portions 22-2 to 22-4 may be equal or substantially equal to one another, for example.

In each of the multilayer substrates 10a to 10g, the widths w1 to w3 of the spaces Sp-1 to Sp-3 may be equal or substantially equal to one another, for example. In this case, the line width W1 of the coil portion 22-1 is preferably smaller than the line widths W2 to W4 of the coil portions 22-2 and 22-4, or alternatively the distance d1 in the up-down axis between the coil portion 22-1 and the coil portion 22-2 is preferably greater than the distance d2 in the up-down axis between the coil portion 22-2 and the coil portion 22-3 and the distance d3 in the up-down axis between the coil portion 22-3 and the coil portion 22-4.

Each of the multilayer substrates 10a to 10g is formed by joining dielectric sheets or magnetic sheets into a body by thermocompression bonding, but may be formed by bonding dielectric sheets or magnetic sheets together by an adhesive, for example. However, dielectric sheets or magnetic sheets are preferably joined into a body by thermocompression bonding, for example. When dielectric sheets or magnetic sheets are bonded together by an adhesive, the adhesive, which is a material different from the materials of the dielectric sheets or the magnetic sheets, intervenes among the dielectric sheets or the magnetic sheets. The adhesive may negatively affect the characteristics of the coil L.

The coil portion 22-1 may include a length corresponding to less than one turn, for example. However, the coil portion 22-1 preferably satisfies the following conditions.

(1) The coil portion 22-1 is a portion defining the outermost turn of the coil L.

(2) An entire length of the coil portion 22-1 is longer than an entire length of the coil portion 22-2.

When the coil L includes coil portions 22-1 to 22-$n$+1, the borders between the coil portions 22-1 to 22-$n$+1 are as follows. The coil portion 22-1 is a portion defining the outermost turn of the coil L. The coil portion 22-$m$ includes a length corresponding to one turn, where m is an integer not less than 2 and not more than n. The coil portion 22-$n$+1 is a portion defining the innermost turn of the coil L and includes a length corresponding to less than one turn.

In the above-described preferred embodiments and modifications, the outer periphery of the coil L is rectangular or substantially rectangular, but the outer periphery of the coil L may be circular or substantially circular, for example.

The multilayer substrates 10a to 10c and 10g do not need to include connectors 100a and 100b attached thereto. In this case, end portions of the multilayer substrates 10a to 10c and 10g are electrically connected to circuit boards by solder or the like, for example. Each of the multilayer substrates 10a to 10c and 10g may include only one connector 100a or 100b attached to one end portion thereof, for example.

In the above-described preferred embodiments and modifications, the connectors 100a and 100b are attached to the bottom surface of each of the multilayer substrates 10a to 10c and 10g. However, the connectors 100a and 100b may be attached to the top surface of each of the multilayer substrates 10a to 10c and 10g, for example. The connector 100a may be attached to the top surface of each of the multilayer substrates 10a to 10c and 10g, and the connector 100b may be attached to the bottom surface of each of the multilayer substrates 10a to 10c and 10g, for example.

The multilayer substrates 10a to 10g may include not only the coil L but also any other circuit element (for example, a capacitor element or the like). The multilayer substrates 10a to 10g may include a strip line structure where the signal line 20 locates between two ground conductors from above and below, for example. Alternatively, the multilayer substrates 10a to 10g may include a microstrip line structure where the signal line 20 faces a ground conductor, for example.

The multilayer substrates 10a to 10g may be included as multilayer substrates in RF circuit boards, for example, antenna front-end modules and the like.

The signal line 20 does not need to be a signal line that transmits of high-frequency signals, for example. The signal line 20 may be a power wire that supplies power or a ground wire that is maintained at a ground potential, for example.

As thus far described above, the preferred embodiments and modifications of the present invention is able to be applied to a multilayer substrate and a manufacturing method thereof, and the preferred embodiments and modifications of the present invention provide a decrease in the capacitance generated in the coil.

While preferred embodiments of the present invention include been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
an element assembly including a plurality of insulating layers stacked along a layer stacking axis including a first direction and a second direction; and
a coil disposed at the element assembly; wherein
a portion of the element assembly at which the coil is not disposed is bent;
the coil includes a spiral of two or more turns when viewed from the layer stacking axis and extending along the first direction and spiraling from outside inward to provide a conical shape;
a portion of the coil defining an outermost turn of the spiral is defined as a first coil portion, an inner portion of the coil that is an $n^{th}$ nearest from the first coil portion is defined as an $n+1^{th}$ coil portion, and a space between the $n^{th}$ coil portion and the $n+1^{th}$ coil portion is defined as an $n^{th}$ space, where n is a natural number;
a width of the first space is greater than widths of the other spaces when viewed from above;
a width of an $m^{th}$ space is greater than a width of an $m+1^{th}$ space, where m is an integer not less than 2 and not more than n; and
a line width of the first coil portion is smaller than line widths of the other coil portions.

2. The multilayer substrate according to claim 1, wherein a line width of an $m^{th}$ coil portion is smaller than a line width of the $m+1^{th}$ coil portion, where m is an integer not less than 2 and not more than n.

3. The multilayer substrate according to claim 1, wherein a distance in the layer stacking axis between the first coil portion and the second coil portion is greater than any other distance in the layer stacking axis between two adjacent ones of the coil portions in the layer stacking axis.

4. The multilayer substrate according to claim 1, wherein the plurality of insulating layers each include thermoplastic resin.

5. The multilayer substrate according to claim 4, wherein the thermoplastic resin includes liquid crystal polymer.

6. The multilayer substrate according to claim 1, wherein the element assembly is flexible.

7. The multilayer substrate according to claim 1, wherein:
the plurality of insulating layers include a first insulating layer and a second insulating layer;
the first coil portion of the coil is disposed on the first insulating layer; and
a second coil portion of the coil is disposed on the second insulating layer.

8. The multilayer substrate according to claim 7, wherein the first coil portion is electrically connected to the second coil portion by a via hole conductor that extends in the layer stacking axis.

9. The multilayer substrate according to claim 1, wherein a central portion of the multilayer substrate in a direction perpendicular or substantially perpendicular to the layer stacking axis is bent at an angle of about 90 degrees.

* * * * *